(12) United States Patent
An et al.

(10) Patent No.: US 12,224,384 B2
(45) Date of Patent: Feb. 11, 2025

(54) DISPLAY DEVICE AND MANUFACTURING METHOD THEREFOR

(71) Applicant: SAMSUNG DISPLAY CO., LTD., Yongin-si (KR)

(72) Inventors: Moon Jung An, Yongin-si (KR); Dong Eon Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 508 days.

(21) Appl. No.: 17/618,166

(22) PCT Filed: Mar. 11, 2020

(86) PCT No.: PCT/KR2020/003401
§ 371 (c)(1),
(2) Date: Dec. 10, 2021

(87) PCT Pub. No.: WO2020/256256
PCT Pub. Date: Dec. 24, 2020

(65) Prior Publication Data
US 2022/0328737 A1 Oct. 13, 2022

(30) Foreign Application Priority Data

Jun. 21, 2019 (KR) .......................... 10-2019-0074111

(51) Int. Cl.
H01L 33/54 (2010.01)
H01L 25/16 (2023.01)
(Continued)

(52) U.S. Cl.
CPC ............ H01L 33/54 (2013.01); H01L 25/167 (2013.01); H01L 33/501 (2013.01); H01L 24/24 (2013.01);
(Continued)

(58) Field of Classification Search
CPC ....... H01L 33/54; H01L 33/501; H01L 33/20; H01L 33/32; H01L 33/38; H01L 2933/0091; H01L 2924/95001
See application file for complete search history.

(56) References Cited

U.S. PATENT DOCUMENTS 5,581,116 A * 12/1996 Nakatsu ................. H01L 33/20
257/623
8,039,040 B2 10/2011 Takeda et al.
(Continued)

FOREIGN PATENT DOCUMENTS

CN 101223826 7/2008
JP 2010-87452 4/2010
(Continued)

OTHER PUBLICATIONS

Indian First Examination Report for Indian Patent Application or Patent No. 202117057218, dated Jun. 21, 2022.
(Continued)

Primary Examiner — Anne M Hines
(74) Attorney, Agent, or Firm — KILE PARK REED & HOUTTEMAN PLLC

(57) ABSTRACT

A display device may include a light emitting element including a first end having a first surface, and a second end having a second surface parallel to the first surface, an organic pattern that overlaps the light emitting element and exposes the first and second surfaces, a first electrode disposed on a substrate and electrically contacting the first end, and a second electrode disposed on the substrate and spaced apart from the first electrode, and electrically contacting the second end. A surface area of the first surface may be less than that of the second surface. A top surface of the organic pattern may be a curved surface.

20 Claims, 17 Drawing Sheets

(51) Int. Cl.
*H01L 33/50* (2010.01)
*H01L 23/00* (2006.01)
*H01L 33/20* (2010.01)
*H01L 33/32* (2010.01)
*H01L 33/38* (2010.01)

(52) U.S. Cl.
CPC .............. *H01L 24/25* (2013.01); *H01L 24/95* (2013.01); *H01L 33/20* (2013.01); *H01L 33/32* (2013.01); *H01L 33/38* (2013.01); *H01L 2224/24051* (2013.01); *H01L 2224/24145* (2013.01); *H01L 2224/245* (2013.01); *H01L 2224/25175* (2013.01); *H01L 2224/95001* (2013.01); *H01L 2224/95101* (2013.01); *H01L 2224/95115* (2013.01); *H01L 2924/0549* (2013.01); *H01L 2924/12041* (2013.01); *H01L 2933/0041* (2013.01); *H01L 2933/005* (2013.01); *H01L 2933/0091* (2013.01)

(56) References Cited

U.S. PATENT DOCUMENTS

| | | | |
|---|---|---|---|
| 10,026,777 | B2 | 7/2018 | Kang et al. |
| 10,672,946 | B2 | 6/2020 | Cho et al. |
| 10,784,246 | B2 | 9/2020 | Do et al. |
| 10,784,419 | B2 | 9/2020 | Yamada et al. |
| 2007/0007883 | A1 | 1/2007 | Takeda et al. |
| 2009/0081480 | A1 | 3/2009 | Takeda et al. |
| 2016/0365480 | A1 | 12/2016 | Mi et al. |
| 2017/0194531 | A1* | 7/2017 | Huang .................. H01L 33/145 |
| 2018/0175009 | A1 | 6/2018 | Kim et al. |
| 2018/0175104 | A1* | 6/2018 | Kang .................... H01L 33/005 |
| 2018/0175106 | A1 | 6/2018 | Kim et al. |
| 2019/0049649 | A1 | 2/2019 | Hayashi et al. |
| 2019/0058085 | A1 | 2/2019 | Ahmed et al. |
| 2019/0096858 | A1 | 3/2019 | Woo et al. |

FOREIGN PATENT DOCUMENTS

| | | |
|---|---|---|
| JP | 2013-4661 | 1/2013 |
| JP | 2016-219613 | 12/2016 |
| KR | 10-2008-0021023 | 3/2008 |
| KR | 10-0819573 | 4/2008 |
| KR | 10-2010-0082215 | 7/2010 |
| KR | 10-2017-0091805 | 8/2017 |
| KR | 10-2018-0007376 | 1/2018 |
| KR | 10-2018-0071465 | 6/2018 |
| KR | 10-2018-0072909 | 7/2018 |
| WO | 2011/149052 | 12/2011 |

OTHER PUBLICATIONS

International Search Report, with English translation, corresponding to International Application No. PCT/KR2020/003401 dated Jun. 12, 2020.

Written Opinion, with English translation, corresponding to International Application No. PCT/KR2020/003401, dated Jun. 12, 2020.

Chinese Office Action for Chinese Patent Application No. 202080040331.1, dated Dec. 18, 2024.

* cited by examiner

DISPLAY DEVICE AND MANUFACTURING METHOD THEREFOR

CROSS-REFERENCE TO RELATED APPLICATION(S)

This application is a national entry of International Application No. PCT/KR2020/003401, filed on Mar. 11, 2020, which claims under 35 U.S.C. §§ 119(a) and 365(b) priority to and benefits of Korean Patent Application No. 10-2019-0074111, filed on Jun. 21, 2019, in the Korean Intellectual Property Office (KIPO), the entire contents of which are incorporated herein by reference.

BACKGROUND

1. Technical Field

The disclosure relate to a display device and a method of fabricating the display device, and more specifically, to a display device including a light emitting element and a method of fabricating the display device.

2. Description of Related Art

A display device may use a light emitting element such as a light emitting diode as a light source of a pixel to display an image. The light emitting diode may maintain relatively satisfactory durability even under poor environmental conditions, and be excellent in terms of lifetime and luminance.

Recently, research on the technology of fabricating a light emitting diode using material having a high-reliability inorganic crystalline structure, and disposing the light emitting diode on a panel of a display device to use it as a next generation pixel light source has become more active. As a part of such research, development of a display device using, as a light source of each pixel, a light emitting diode fabricated in a small size corresponding to the micro-scale or the nano-scale is ongoing.

SUMMARY

In an alignment scheme using an inkjet printing process among schemes of aligning light emitting elements, an interval between the light emitting elements and a position of each light emitting element cannot be adjusted, so it may be problematic in that pixels of a display device emits uneven light. Furthermore, in the alignment scheme using the inkjet printing process, some of the light emitting elements may not be aligned. The light emitting elements that are not aligned may cause a defect during a subsequent process.

An object of the disclosure is to provide a display device in which light emitting elements may be uniformly aligned, and a method of fabricating the display device.

The objects of the disclosure are not limited to the above-stated object, and those skilled in the art will clearly understand other not mentioned objects from the accompanying claims.

According to an aspect of the disclosure, a display device may include a light emitting element disposed on a substrate, and comprising a first end including a first surface, and a second end including a second surface parallel to the first surface; an organic pattern that overlaps the light emitting element and exposes the first surface and the second surface; a first electrode disposed on the substrate and electrically contacting the first end; and a second electrode disposed on the substrate and spaced apart from the first electrode, and electrically contacting the second end. A surface area of the first surface may be less than a surface area of the second surface. A top surface of the organic pattern may be a curved surface.

In an embodiment, the top surface of the organic pattern may be a convex surface protruding in a thickness direction of the substrate.

In an embodiment, the display device may further include scattering particles dispersed in the organic pattern. The scattering particles may include at least one of titanium oxide ($TiO_2$), zirconium oxide ($ZrO_2$), aluminum oxide ($Al_2O_3$), indium oxide ($In_2O_3$), zinc oxide (ZnO), and tin oxide ($SnO_2$).

In an embodiment, the display device may further include wavelength conversion particles dispersed in the organic pattern. The wavelength conversion particles may include quantum dots.

In an embodiment, the display device may further include a first reflective pattern disposed adjacent to the first surface, and a second reflective pattern disposed adjacent to the second surface.

In an embodiment, the first reflective pattern may include a first bank disposed on the substrate, and a first reflective layer disposed along a surface of the first bank. The second reflective pattern may include a second bank disposed on the substrate, and a second reflective layer disposed along a surface of the second bank.

In an embodiment, the first electrode may overlap the first reflective pattern and be disposed on the first reflective layer. The second electrode may overlap the second reflective pattern and be disposed on the second reflective layer.

In an embodiment, the first bank and the second bank each may include a trapezoidal shape having sidewalls inclined at an angle.

According to another aspect of the disclosure, a display device may include a light emitting element disposed on a substrate at regular intervals in a first direction, and comprising a first end including a first surface, and a second end including a second surface parallel to the first surface; a plurality of organic patterns respectively disposed on the light emitting elements, and each exposing the first surface and the second surface; a first electrode electrically contacting the first end, and a second electrode electrically contacting the second end, the first electrode and the second electrode are disposed on the substrate and spaced apart from each other in a second direction intersecting the first direction. A top surface of each of the plurality of organic patterns may be a convex surface protruding in a third direction intersecting the first direction and the second direction.

In an embodiment, the plurality of organic patterns may be spaced apart from each other without contacting each other.

The display device may further include scattering particles dispersed in the plurality of organic patterns. The scattering particles may include at least one of titanium oxide ($TiO_2$), zirconium oxide ($ZrO_2$), aluminum oxide ($Al_2O_3$), indium oxide ($In_2O_3$), zinc oxide (ZnO), and tin oxide ($SnO_2$).

12. The display device may further include wavelength conversion particles dispersed in the plurality of organic patterns. The wavelength conversion particles may include quantum dots.

The display device may further include a first reflective pattern disposed adjacent to the first end and disposed on the substrate; and a second reflective pattern disposed adjacent to the second end and disposed on the substrate.

According to another aspect of the disclosure, a method of fabricating a display device may include preparing a gravure substrate including a groove; disposing, into the groove, ink including a base resin and light emitting elements dispersed in the base resin; transferring the ink disposed in the groove to a blanket; transferring, to the substrate, the ink transferred to the blanket; forming an organic pattern by removing at least a portion of the base resin; and forming, on the substrate, a first electrode and a second electrode partially overlapping the light emitting element, and spaced apart from each other in a direction.

In an embodiment, the light emitting element may include a first surface, and a second surface parallel to the first direction. A surface area of the first surface may be less than a surface area of the second surface. The forming of the organic pattern may include removing at least a portion of the base resin such that the first surface and the second surface are exposed.

In an embodiment, the first electrode may electrically contact the first surface, and the second electrode may electrically contact the second surface.

In an embodiment, a top surface of the organic pattern may be a curved surface.

In an embodiment, the disposing of the ink including the base resin and the light emitting elements may include applying the ink onto the gravure substrate; and removing, using a blade that scrapes a surface of the gravure surface, the ink that is not disposed into the groove.

In an embodiment, in a plan view, a surface area of the groove may be greater than a surface area of the light emitting element, and one light emitting element is disposed into the groove.

In an embodiment, the gravure substrate may include a plurality of grooves, and the plurality of grooves may be spaced apart from each other at regular intervals.

Details of various embodiments are included in the detailed descriptions and drawings.

Various embodiments may provide a display device in which light emitting elements are disposed in a desired shape through a gravure off-set printing scheme, and a method of fabricating the display device.

Furthermore, various embodiments of the disclosure may provide a display device in which an organic pattern is formed over the light emitting element so that the light output efficiency may be improved, and a method of fabricating the display device.

The effects of the disclosure are not limited by the foregoing, and other various effects are anticipated herein.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Figure 1A:
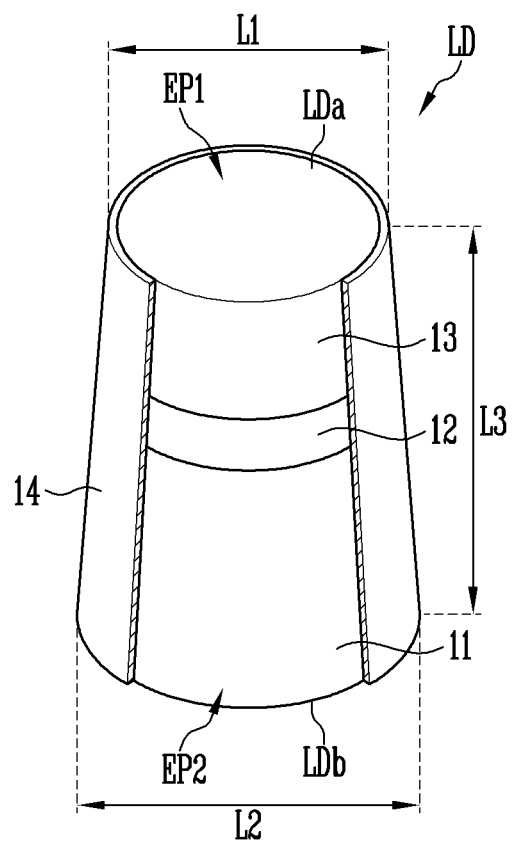
FIGS. 1A and 1B are perspective views each schematically illustrating a light emitting element in accordance with an embodiment of the disclosure.

Advantages and features of the disclosure, and methods for achieving the same will be cleared with reference to embodiments described later in detail together with the accompanying drawings. The disclosure may, however, be embodied in many different forms and should not be construed as being limited to the embodiments set forth herein. Rather, these embodiments are provided so that this disclosure will be thorough and complete and will fully convey the concept of the disclosure to those skilled in the art, and the disclosure will only be defined by the appended claims.

It will be understood that when an element or a layer is referred to as being "on" another element or a layer, it can be directly on, connected to, or coupled to the other element or the layer, or one or more intervening elements or layers may be present. Like reference numerals refer to like elements throughout.

It will be understood that, although the terms "first," "second," and the like may be used herein to describe various elements, these elements should not be limited by these terms. These terms are only used to distinguish one element from another element. For instance, a first element discussed below could be termed a second element without departing from the teachings of the disclosure. In the disclosure, the singular forms are intended to include the plural forms as well, unless the context clearly indicates otherwise.

The phrase "at least one of" is intended to include the meaning of "at least one" selected from the group of for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments of the disclosure will be described in detail with reference to the accompanying drawings.

Figure 1B:
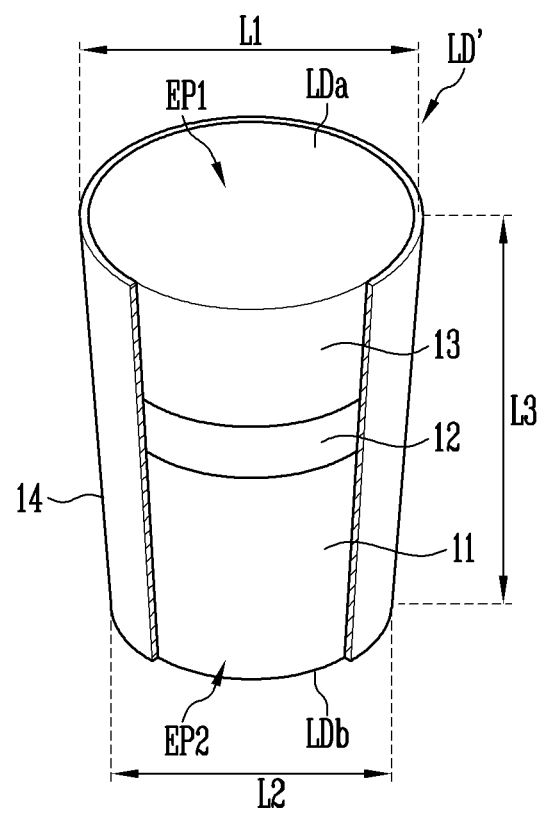

FIGS. 1A and 1B are schematic perspective views each illustrating a light emitting element in accordance with an embodiment.

Referring to FIG. 1A, a light emitting element LD in accordance with an embodiment may include a first semiconductor layer 11, a second semiconductor layer 13, and an active layer 12 interposed between the first and second semiconductor layers 11 and 13. For example, the light emitting element LD may be implemented as a stack formed by successively stacking the first semiconductor layer 11, the active layer 12, and the second semiconductor layer 13.

In an embodiment, the light emitting element LD may be provided in a vertically asymmetrical shape in which a surface area of a top surface LDa and a surface area of a bottom surface LDb are different from each other. For example, the light emitting element LD may be provided in a truncated shape such as a truncated conical shape or a truncated polypyramid shape. In other words, the light emitting element LD may include the top surface LDa and the bottom surface LDb which are parallel to each other and have different surface areas, and may have an equilateral trapezoidal shape in a cross-sectional view. Hereinafter, for the sake of explanation, the light emitting element LD will be described as having a truncated conical shape, but the shape of the light emitting element LD is not limited thereto.

The top surface LDa of the light emitting element LD may be a top surface of the second semiconductor layer 13. The bottom surface LDb of the light emitting element LD may be a bottom surface of the first semiconductor layer 11. As illustrated in FIG. 1A, a diameter L1 of the top surface LDa (or a width of the top surface LDa) of the light emitting element LD may be less than a diameter L2 of the bottom surface LDb (or a width of the bottom surface LDb). In other words, the surface area of the top surface LDa of the light emitting element LD may be less than the surface area of the bottom surface LDb.

A distance H3 between the top surface LDa and the bottom surface LDb of the light emitting element LD (for example, a height of the light emitting element LD) may be greater than the diameter L1 of the top surface LDa and the diameter L2 of the bottom surface LDb. In other words, the light emitting element LD may include a rod-like shape or a bar-like shape which is long in a longitudinal direction.

However, the disclosure is not limited thereto. As illustrated in FIG. 1B, a diameter L1 of a top surface LDa of a light emitting element LD' may be greater than a diameter L2 of a bottom surface LDb thereof. In other words, the surface area of the top surface LDa of the light emitting element LD' may be greater than the surface area of the bottom surface LDb. The light emitting element LD may include a first end EP1 including the top surface LDa, and a second end EP2 including the bottom surface LDb.

The light emitting element LD may be fabricated in a small size having a diameter and/or length corresponding to, e.g., a micro-scale or nano-scale size. For example, the diameter of the light emitting element LD may be equal to or less than about 600 nm, and the length of the light emitting element LD may be equal to or less than about 4 µm. However, the size of the light emitting element LD is not limited thereto. For instance, the size of the light emitting element LD may be changed to meet requirements of a display device to which the light emitting element LD is applied.

The first semiconductor layer 11 may include, for example, at least one n-type semiconductor layer. For instance, the first semiconductor layer 11 may include a semiconductor layer which includes any semiconductor material of InAlGaN, GaN, AlGaN, InGaN, AlN, and InN and is doped with a first dopant such as Si, Ge, or Sn.

A material forming the first semiconductor layer 11 is not limited thereto, and the first semiconductor layer 11 may be formed of various other materials.

The active layer 12 may be formed on the first semiconductor layer 11 and have a single or multiple quantum well structure. The active layer 12 may emit light having a wavelength ranging from about 400 nm to about 900 nm and use a double heterostructure. In an embodiment, a cladding layer (not shown) doped with a dopant may be formed on and/or under the active layer 12. For example, the cladding layer may be formed of an AlGaN layer or an InAlGaN layer. In an embodiment, a material such as AlGaN or AlInGaN may also be used to form the active layer 12, and various other materials may be used to form the active layer 12.

If an electric field having a predetermined voltage or more is applied to the opposite ends of the light emitting element LD, the light emitting element LD emits light by coupling or combining of electron-hole pairs in the active layer 12. Since light emission of the light emitting element LD can be controlled based on the foregoing principle, the light emitting element LD may be used as a light source of various light emitting devices as well as a pixel of the display device.

The second semiconductor layer 13 may be provided on the active layer 12 and include a semiconductor layer of a type different from that of the first semiconductor layer 11. For example, the second semiconductor layer 13 may include at least one p-type semiconductor layer. For instance, the second semiconductor layer 13 may include a semiconductor layer which includes any semiconductor material of InAlGaN, GaN, AlGaN, InGaN, AlN, and InN and is doped with a second dopant such as Mg. A material forming the second semiconductor layer 13 is not limited thereto, and the second semiconductor layer 13 may be formed of various other materials.

In an embodiment, the light emitting element LD may not only include the first semiconductor layer 11, the active layer 12, and the second semiconductor layer 13, but may also include a fluorescent layer, another active layer, another semiconductor layer, and/or an electrode layer provided on and/or under each layer.

The light emitting element LD may further include an insulating film 14. However, in an embodiment, the insulating film 14 may be omitted, or may be provided to cover some of the first semiconductor layer 11, the active layer 12, and the second semiconductor layer 13. For example, the insulating film 14 may be provided on a portion of the light emitting element LD, other than the opposite ends thereof, so that the opposite ends of the light emitting element LD are exposed.

For the sake of explanation, FIGS. 1A and 1B illustrate the insulating layer 14 a portion of which has been removed. The entirety of the side surface of the light emitting element LD may be enclosed by the insulating layer 14.

In an embodiment, the insulating layer 14 may include a transparent insulating material. For example, the insulating layer 14 may include at least one or more insulating materials among $SiO_2$, $Si_3N_4$, $Al_2O_3$, and $TiO_2$, but the disclosure is not limited thereto. In other words, various materials having insulation properties may be employed.

The insulating layer 14 may prevent the active layer 12 from short-circuiting due to making contact with a conductive material except the first semiconductor layer 11 and the second semiconductor layer 13. Thanks to the insulating film 14, occurrence of a defect in the surface of the light emitting element LD may be reduced or minimized, whereby the lifetime and efficiency of the light emitting element LD may be improved. In case that light emitting elements LD are disposed in close contact with each other, the insulating film 14 may prevent an undesired short circuit from occurring between the light emitting elements LD.

The type, structure, and shape, etc. of the light emitting element LD in accordance with an embodiment may be changed in various ways.

Figure 2:
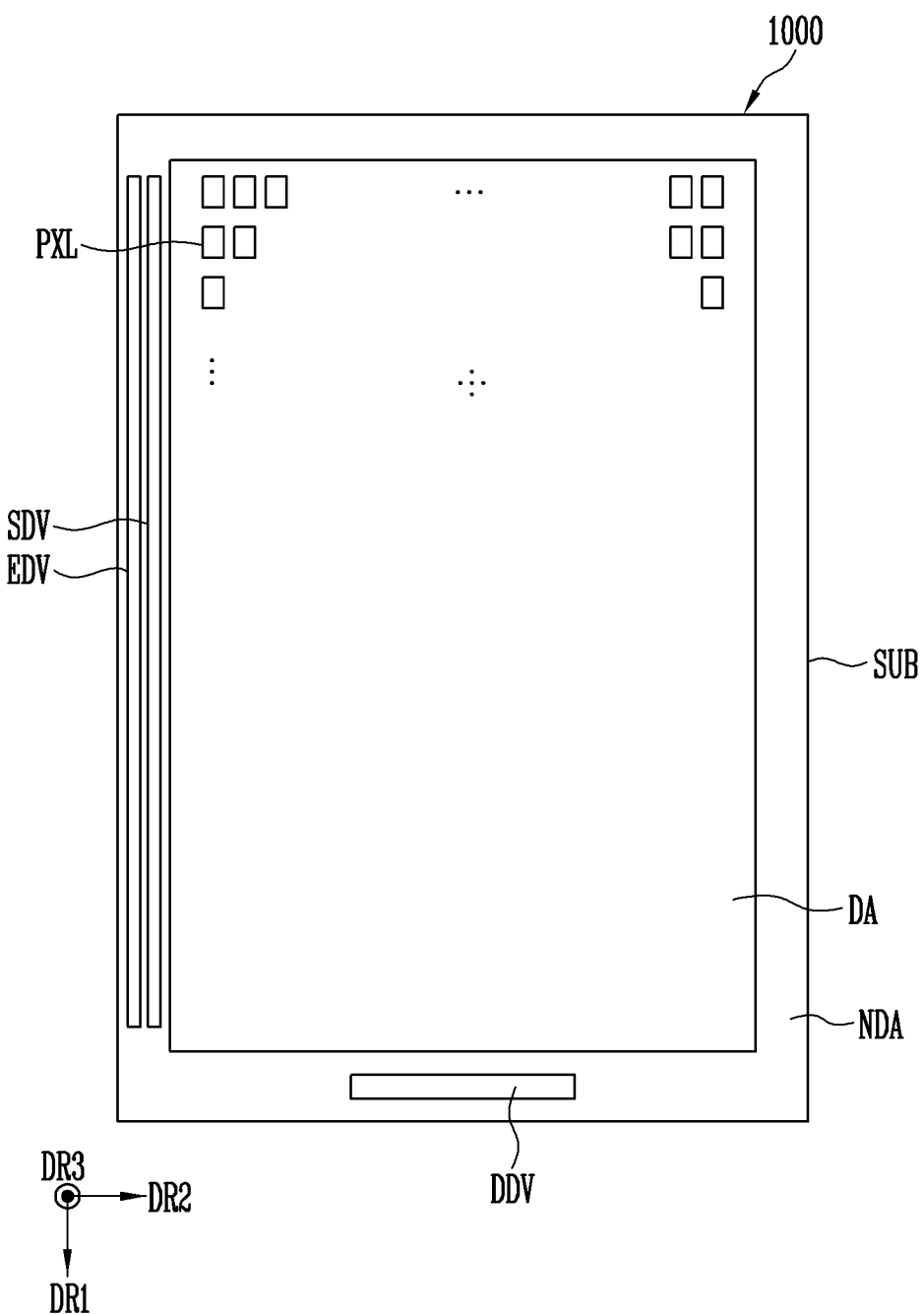
FIG. 2 is a plan view schematically illustrating a display device in accordance with an embodiment of the disclosure.

FIG. 2 is a plan view schematically illustrating a display device in accordance with an embodiment.

Referring to FIGS. 1A and 2, a display device 1000 may include a substrate SUB and pixels PXL provided on the substrate SUB. In detail, the display device 1000 may include a display area DA configured to display an image, and a non-display area NDA other than the display area DA.

The display area DA may be an area in which pixels PXL are provided. The non-display area NDA may be an area in which drivers for driving the pixels PXL and various lines (not illustrated) for coupling or connecting the pixels PXL to the drivers are provided.

The display area DA may have various shapes. For example, the display area DA may be provided in various forms such as a closed polygon including sides formed of linear lines, a circle, an ellipse, or the like including a side formed of a curved line, and a semicircle, a semi-ellipse, or the like including sides formed of a linear line and a curved line.

In case that the display area DA includes areas, each area may be provided in various forms such as a closed polygon including linear sides and a semicircle a semi-ellipse, or the like including sides formed of a curved line. The surface areas of the areas may be the same as or different from each other.

In an embodiment, there will be described an example in which the display area DA is provided as a single area having a rectangular shape including linear sides.

The non-display area NDA may be provided on at least one side of the display area DA. In an embodiment, the non-display area NDA may enclose the display area DA.

The pixels PXL may be disposed in the display area DA on the substrate SUB. Each of the pixels PXL may include at least one light emitting element LD configured to be driven in response to a corresponding scan signal and a corresponding data signal.

The pixels PXL each may include a light emitting element which emits white light and/or color light. Each pixel PXL may emit light having any color among red, green, and blue, and the disclosure is not limited thereto. For example, each of the pixels PXL may emit light having any color among cyan, magenta, yellow, and white.

The pixels PXL may be arranged in a matrix form having rows and columns extending in a first direction DR1 and a second direction DR2 intersecting the first direction DR1. However, the arrangement of the pixels PXL is not limited to a particular arrangement. In other words, the pixels PXL may be arranged in various forms.

The drivers may provide signals to each pixel PXL through the lines (not illustrated) and thus control the operation of the pixel PXL. As illustrated in FIG. 2, the lines are omitted for the sake of convenience of explanation.

The drivers may include a scan driver SDV configured to provide scan signals to the pixels PXL through scan lines, an emission driver EDV configured to provide emission control signals to the pixels PXL through emission control lines, a data driver DDV configured to provide data signals to the pixels PXL through data lines, and a timing controller (not illustrated). The timing controller may control the scan driver SDV, the emission driver EDV, and the data driver DDV.

In an embodiment, each of the pixels PXL may be formed of an active pixel. However, the types, structures, and/or driving schemes of the pixels PXL capable of being applied to the disclosure are not particularly limited.

Figure 3A:
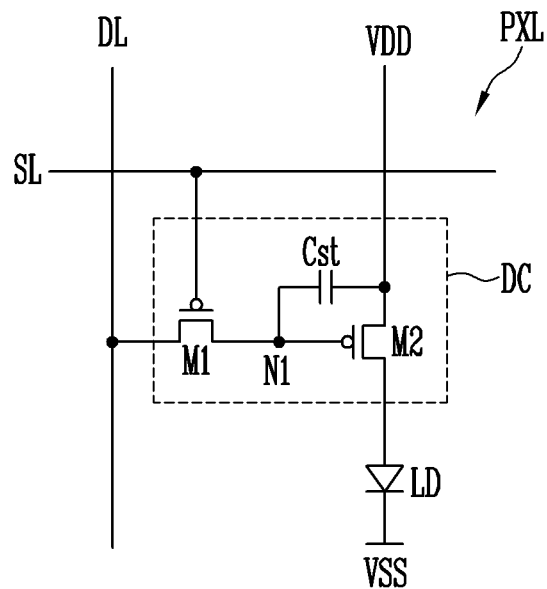
FIGS. 3A and 3B are circuit diagrams each schematically illustrating a pixel in accordance with an embodiment of the disclosure.
Figure 3B:
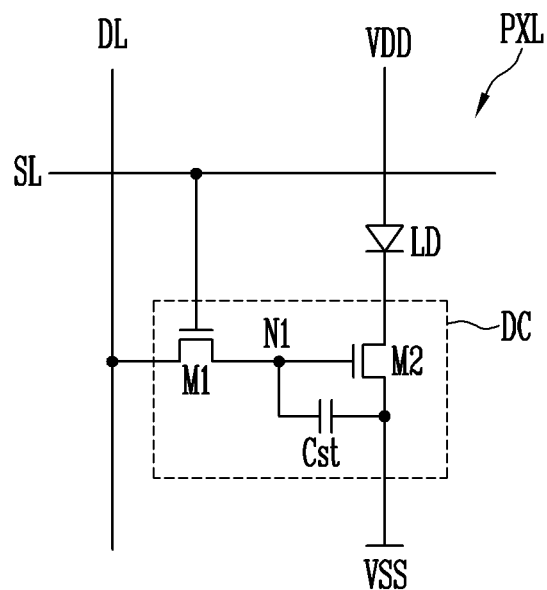

FIGS. 3A and 3B are circuit diagrams each schematically illustrating a pixel in accordance with an embodiment. Particularly, FIGS. 3A and 3B illustrate examples of a pixel that forms an active emission display panel.

Referring to FIG. 3A, the pixel PXL may include at least one light emitting element LD, and a pixel driving circuit (or driving circuit) DC which is electrically connected to the light emitting element LD and configured to drive the light emitting element LD.

A first electrode (e.g., an anode) of the light emitting element LD may be electrically connected to a first driving power supply VDD via the driving circuit DC. A second electrode (e.g., a cathode) of the light emitting element LD may be electrically connected to a second driving power supply VSS.

The first driving power supply VDD and the second driving power supply VSS may have different potentials. For example, the second driving power supply VSS may have a potential lower than that of the first driving power supply VDD by a value equal to or greater than a threshold voltage of the light emitting element LD.

The light emitting element LD may emit light at a luminance corresponding to driving current which is controlled by the driving circuit DC.

Although FIG. 3A illustrates an embodiment in which the pixel PXL includes a light emitting element LD, the disclosure is not limited thereto. For example, the pixel PXL may include light emitting elements electrically connected in parallel and/or series to each other.

In an embodiment, the driving circuit DC may include a first transistor M1, a second transistor M2, and a storage capacitor Cst. The structure of the driving circuit DC is not limited to that of the embodiment illustrated in FIG. 3A. In an embodiment, the pixel PXL may further include a pixel sensing circuit (not illustrated). The pixel sensing circuit may measure a driving current value of each pixel PXL and transmit the measured value to an external circuit (e.g., a timing controller) to compensate for the pixel PXL.

The first transistor (or switching transistor) M1 may include a first electrode electrically connected to a data line DL, and a second electrode electrically connected to a first node N1. Here, the first electrode and the second electrode of the first transistor M1 may be different electrodes. For example, if the first electrode is a source electrode, the second electrode is a drain electrode. A gate electrode of the first transistor M1 may be electrically connected to a scan line SL.

In case that a scan signal having a voltage (e.g., a gate-on voltage) capable of turning on the first transistor M1 is supplied from the scan line SL, the first transistor M1 is turned on to electrically connect the data line DL with the first node N1. Here, a data signal of a corresponding frame is supplied to the data line DL, and thus the data signal may be transmitted to the first node N1. The data signal transmitted to the first node N1 may be stored in the storage capacitor Cst.

The second transistor (or driving transistor) M2 may include a first electrode electrically connected to the first driving power supply VDD, and a second electrode electrically connected to a first electrode (e.g., an anode) of the light emitting element LD. A gate electrode of the second transistor M2 may be electrically connected to the first node N1. The second transistor M2 may control the amount of driving current to be supplied to the light emitting element LD in response to the voltage of the first node N1.

A first electrode of the storage capacitor Cst may be electrically connected to the first driving power supply VDD, and a second electrode thereof may be electrically connected to the first node N1. The storage capacitor Cst may be charged with a voltage corresponding to a data signal supplied to the first node N1, and maintain the charged voltage until a data signal of a subsequent frame is supplied.

For the sake of explanation, FIG. 3A illustrates a driving circuit DC having a relatively simple structure including the first transistor M1 configured to transmit a data signal to the pixel PXL, the storage capacitor Cst configured to store the data signal, and the second transistor M2 configured to supply driving current corresponding to the data signal to the light emitting element LD.

However, the disclosure is not limited thereto, and the structure of the driving circuit DC may be changed in various ways. For example, the driving circuit DC may further include at least one transistor such as a transistor configured to compensate for the threshold voltage of the second transistor M2, a transistor configured to initialize the first node N1, and/or a transistor configured to control an emission time of the light emitting element LD, or other circuit elements such as a boosting capacitor for boosting the voltage of the first node N1.

Furthermore, although FIG. 3A illustrates that the transistors, e.g., the first and second transistors M1 and M2, included in the driving circuit DC are formed of P-type transistors, the disclosure is not limited thereto. In other words, at least one of the first and second transistors M1 and M2 included in the driving circuit DC may be changed to an N-type transistor.

For example, referring to FIG. 3B, each of the first and second transistors M1 and M2 of the driving circuit DC may be formed of an N-type transistor. The configuration and operation of the driving circuit DC illustrated in FIG. 3B may be different from those of the driving circuit DC of FIG. 3A at least in connection positions of some components due to a change in the type of transistor. Therefore, detailed descriptions thereof will be omitted.

Figure 4:
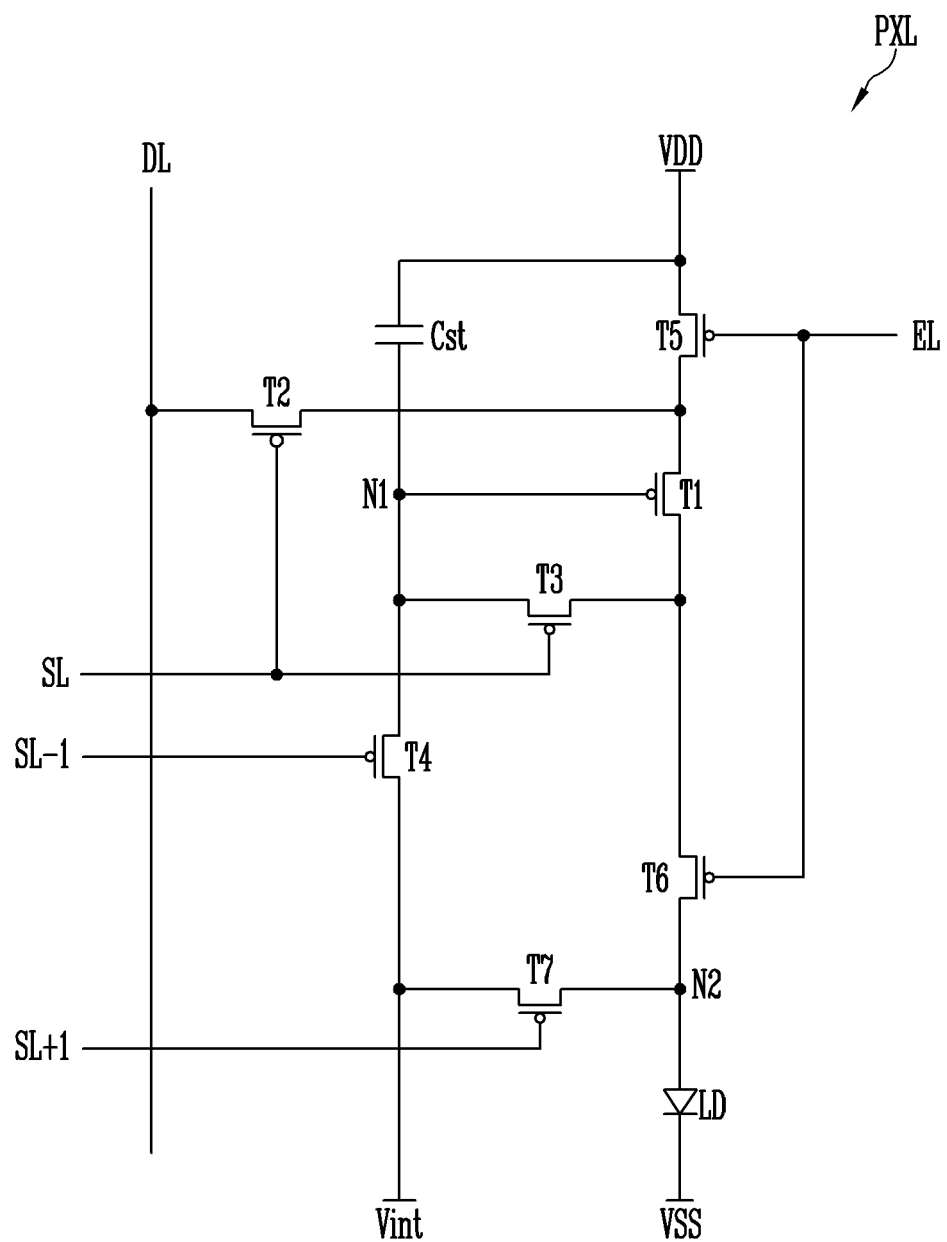
FIG. 4 is a circuit diagram schematically illustrating a pixel in accordance with an embodiment of the disclosure.

FIG. 4 is a circuit diagram schematically illustrating a pixel in accordance with an embodiment.

Referring to FIG. 4, a pixel PXL in accordance with an embodiment may include a light emitting device LD, first to seventh transistors T1, T2, T3, T4, T5, T6, and T7, and a storage capacitor Cst.

A first electrode (e.g., an anode) of the light emitting element LD may be electrically connected to the first transistor T1 via the sixth transistor T6. A second electrode (e.g., a cathode) of the light emitting element LD may be electrically connected to a second driving power supply VSS. The light emitting element LD may emit light having a predetermined luminance corresponding to current supplied from the first transistor T1.

The first transistor (or driving transistor) T1 may include a first electrode electrically connected to the first driving power supply VDD via the fifth transistor T5, and a second electrode electrically connected to a first electrode of the light emitting device LD via the sixth transistor T6. The first transistor T1 may control, in response to the voltage of the first node N1 that is a gate electrode thereof, the amount of current flowing from the first driving power supply VDD to the second driving power supply VSS via the light emitting element LD.

The second transistor (or switching transistor) T2 may be electrically connected between a data line DL and the first electrode of the first transistor T1. A gate electrode of the second transistor T2 may be electrically connected to a scan line SL. In case that a scan signal having a gate-on voltage is supplied to the scan line SL, the second transistor T2 may be turned on so that the data line DL may be electrically connected with the first electrode of the first transistor T1.

The third transistor T3 may be electrically connected between the second electrode of the first transistor T1 and the first node N1. A gate electrode of the third transistor T3 may be electrically connected to the scan line SL. In case that a scan signal having a gate-on voltage is supplied from the scan line SL, the third transistor T3 may be turned on so that the second electrode of the first transistor T1 may be electrically connected with the first node N1.

The fourth transistor T4 may be electrically connected between the first node N1 and an initialization power supply Vint. A gate electrode of the fourth transistor T4 may be electrically connected to a scan line SL−1 of a preceding stage. In case that a scan signal having a gate-on voltage is supplied to the scan line SL−1 of the preceding stage, the fourth transistor T4 is turned on so that the voltage of the initialization power supply Vint may be supplied to the first node N1. The initialization power supply Vint may be set to a voltage lower than that of a data signal.

The fifth transistor T5 may be electrically connected between the first driving power supply VDD and the first electrode of the first transistor T1. A gate electrode of the fifth transistor T5 may be electrically connected to an i-th emission control line EL. The fifth transistor T5 may be turned on in case that an emission control signal having a gate-on voltage is supplied to the i-th emission control line EL, and may be turned off in other cases.

The sixth transistor T6 is electrically connected between the second electrode of the first transistor T1 and a second node N2, which is electrically connected to the first electrode of the light emitting element LD. A gate electrode of the sixth transistor T6 may be electrically connected to an i-th emission control line EL. The sixth transistor T6 may be turned on in case that an emission control signal having a gate-on voltage is supplied to the i-th emission control line EL, and may be turned off in other cases.

The seventh transistor T7 may be electrically connected between the initialization power supply Vint and the first electrode of the light emitting element LD. A gate electrode of the seventh transistor T7 may be electrically connected to a scan line SL+1 of a subsequent stage. In case that a scan signal having a gate-on voltage is supplied to the scan line SL+1 of the subsequent stage, the seventh transistor T7 may be turned on so that the voltage of the initialization power supply Vint may be supplied to the first electrode of light emitting element LD.

The storage capacitor Cst may be electrically connected between the first driving power supply VDD and the first node N1. The storage capacitor Cst may store a voltage corresponding both to a data signal and to a threshold voltage of the first transistor T1.

Although FIG. 4 illustrates that the transistors, e.g., the first to seventh transistors T1, T2, T3, T4, T5, T6, and T7, included in the driving circuit DC are formed of P-type transistors, the disclosure is not limited thereto. For example, at least one of the first to seventh transistors T1, T2, T3, T4, T5, T6, and T7 may be changed to an N-type transistor.

Figure 5:
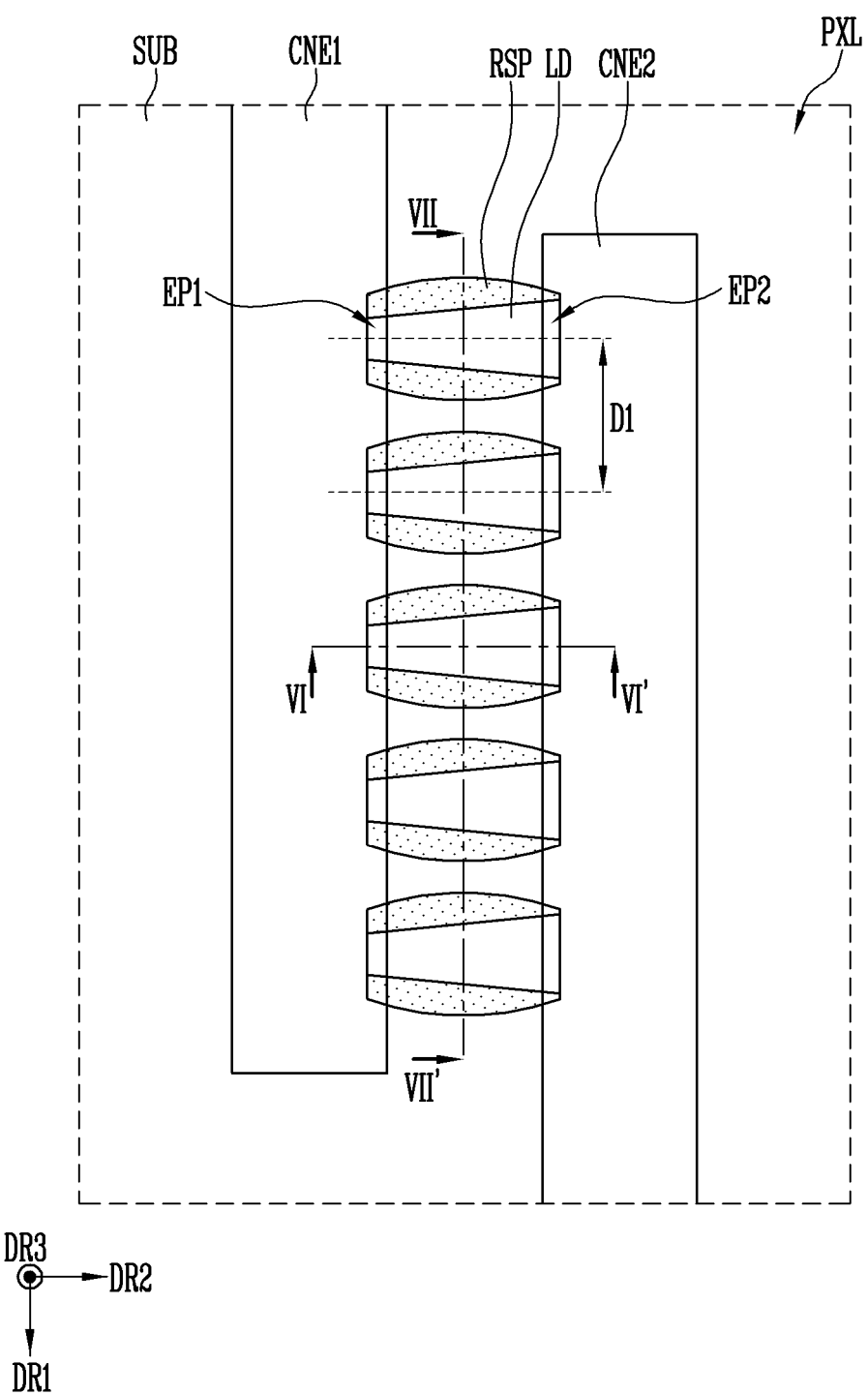
FIG. 5 is a plan view schematically illustrating a pixel in accordance with an embodiment of the disclosure.
Figure 6A:
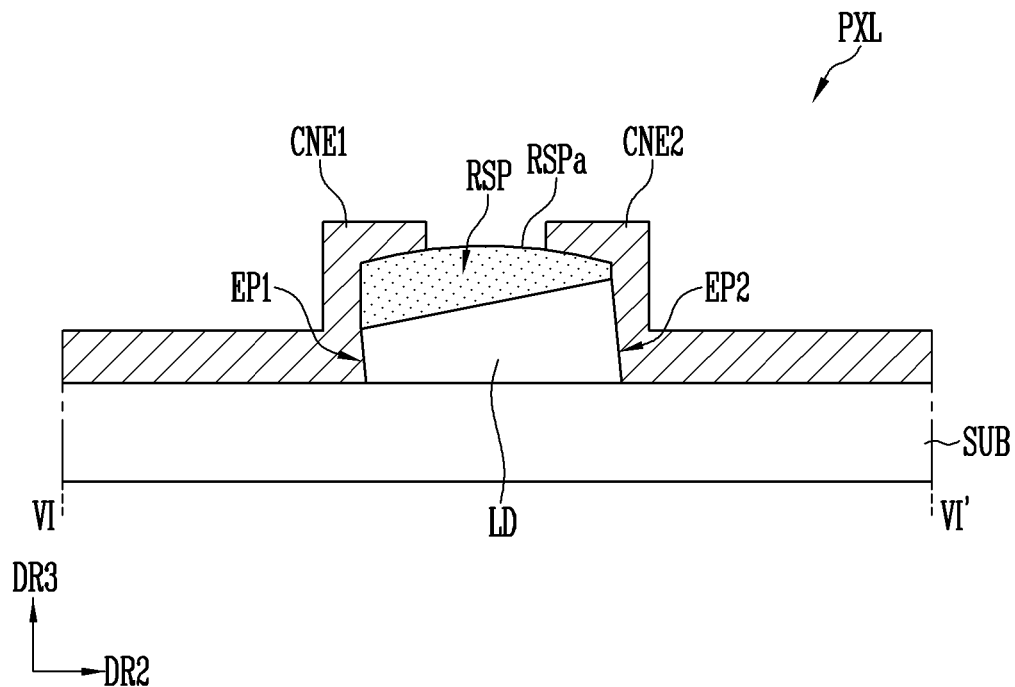
FIGS. 6A and 6B are cross-sectional views taken along line VI-VI' of FIG. 5.
Figure 6B:
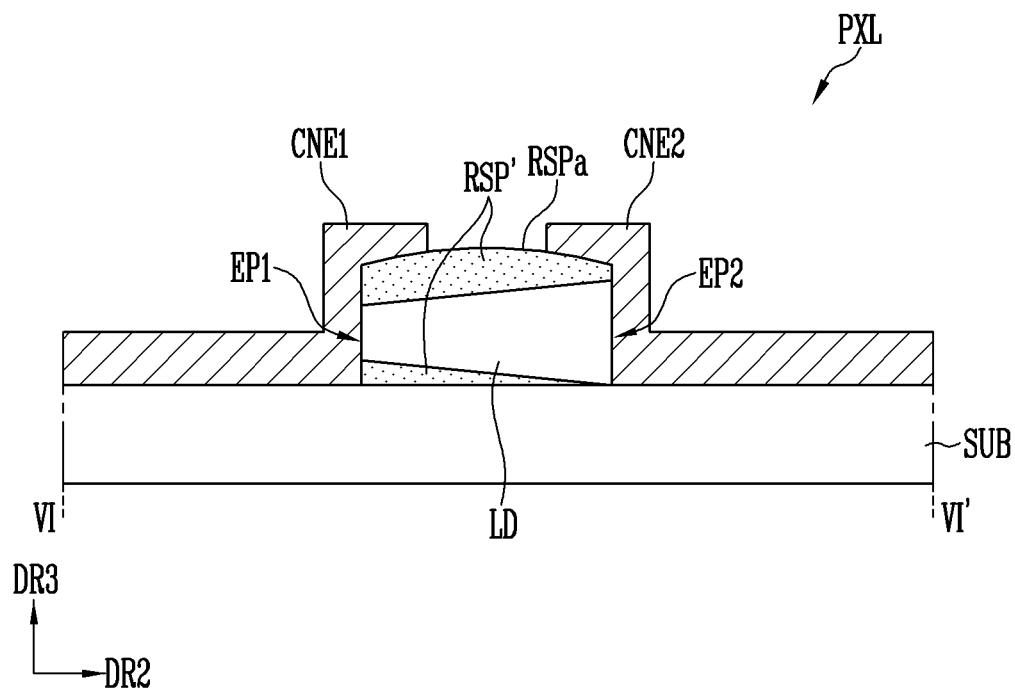
Figure 7:
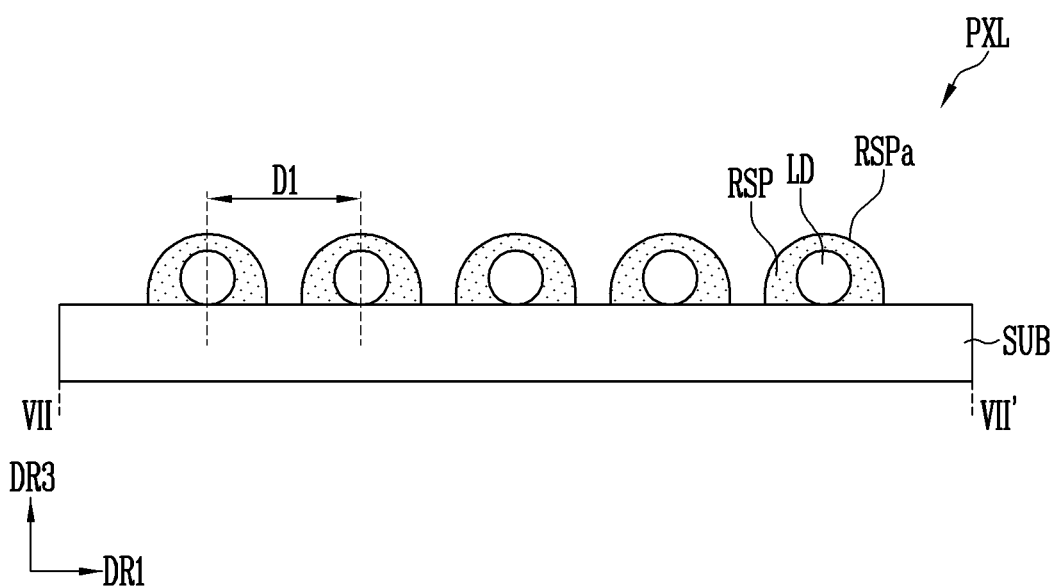
FIG. 7 is a cross-sectional view taken along line VII-VII' of FIG. 5.

FIG. 5 is a schematic plan view illustrating a pixel in accordance with an embodiment. FIGS. 6A and 6B are schematic cross-sectional views taken along line VI-VI' of FIG. 5. FIG. 7 is a schematic cross-sectional view taken along line VII-VII' of FIG. 5.

Although for the sake of explanation each electrode is simply illustrated as being formed of a single electrode layer, the disclosure is not limited thereto. In an embodiment, the words "components are provided and/or formed on the same layer" may mean that the components are formed by a same process.

Referring to FIGS. 5 to 7, the display device in accordance with an embodiment may include a substrate SUB, light emitting elements LD, an organic pattern RSP, and first and second electrodes CNE1 and CNE2.

The substrate SUB may be a rigid substrate or a flexible substrate, and the material or properties thereof are not particularly limited. For example, the substrate SUB may be a rigid substrate made of glass or reinforced glass, or a flexible substrate formed of a thin film made of plastic or metal. Furthermore, the substrate SUB may be a transparent substrate, but the disclosure is not limited thereto. For instance, the substrate SUB may be a translucent substrate, an opaque substrate, or a reflective substrate.

The light emitting elements LD may be disposed on the substrate SUB. In a plan view, the light emitting elements LD may be arranged at a first interval D1 in the first direction DR1. The first interval D1 (or an arrangement interval) of the light emitting element LD may be adjusted as needed. Furthermore, the light emitting elements LD may be oriented in an identical direction. For example, the first end EP1 of the light emitting element LD may face a side opposite to the second direction DR2, and the second end EP2 thereof may face a side corresponding to the second direction DR2. As another example, the first end EP1 of the light emitting element LD may face the side corresponding to the second direction DR2, and the second end EP2 thereof may face the side opposite to the second direction DR2.

In an embodiment, each light emitting element LD may be a blue light emitting element configured to emit blue light. However, the type of light emitting element LD is not limited thereto. In an embodiment, the light emitting elements LD may include all of a red light emitting element configured to emit red light, a green light emitting element configured to emit green light, and a blue light emitting element.

The organic pattern RSP may be disposed on each of the light emitting elements LD. In other words, the organic patterns RSP along with the light emitting elements LD may be disposed at regular intervals in the first direction DR1.

The organic pattern RSP may cover (or overlap) at least a portion of the light emitting element LD. The organic patterns RSP disposed on the respective light emitting elements LD may be spaced apart from each other rather than contacting each other. However, the disclosure is not limited thereto. At least respective portions of the organic patterns RSP may contact each other in the first direction DR1.

The organic pattern RSP may be an organic insulating pattern formed of an organic material. The organic pattern RSP may include a material having a high optical transmittance. For example, the organic pattern RSP may include an organic material such as epoxy resin, acrylic resin, cardo resin, or imide resin, but the disclosure is not limited thereto.

In an embodiment, at least a portion of a top surface RSPa of the organic pattern RSP may be a curved surface. For example, the top surface RSPa of the organic pattern RSP may be a convex surface which protrudes in a thickness direction (for example, a third direction DR3) of the substrate SUB. In other words, the top surface RSPa of the organic pattern RSP may have a convex cross-sectional shape.

In case that the top surface RSPa of the organic pattern RSP includes a convex surface, at least some of light rays emitted from the active layer 12 (see FIG. 1A) of the light emitting element LD in random directions may be refracted in the third direction DR3 by the top surface RSPa. In other words, the light output efficiency of the display device may be improved.

The shape of the top surface RSPa of the organic pattern RSP is not limited thereto. In an embodiment, the top surface RSPa of the organic pattern RSP may be substantially parallel to the top surface of the substrate SUB. In an embodiment, the top surface RSPa of the organic pattern RSP may include a concave surface which is recessed in a direction opposite to the third direction DR3.

A sidewall of the organic pattern RSP may correspond to the light emitting element LD or be disposed at an inner side than a sidewall of the light emitting element LD. Therefore, the first end EP1 and the second end EP2 of the light emitting element LD may be exposed to the outside. In other words, the top surface and the bottom surface of the light emitting element LD may be exposed to the outside.

As described above, FIG. 6A illustrates a structure in which the organic pattern RSP is not disposed between the light emitting element LD and the substrate SUB. For example, the light emitting element LD may have a density higher than that of the organic pattern RSP, so that the light emitting elements LD may contact the substrate SUB, as illustrated in FIG. 6A.

However, the disclosure is not limited thereto. In some embodiments, at least a portion of the organic pattern RSP may be disposed between the light emitting element LD and the substrate SUB. For example, as illustrated in FIG. 6B, an organic pattern RSP' may be at least partially disposed between the light emitting element LD and the substrate SUB. In this case, a center axis of the light emitting element LD may be substantially parallel to the top surface of the substrate SUB.

The first and second electrodes CNE1 and CNE2 may be provided on the organic pattern RSP and the light emitting element LD.

In a plan view, the first and second electrodes CNE1 and CNE2 may extend in the first direction DR1 and be spaced apart from each other in the second direction DR2. The light emitting elements LD may be disposed between the first electrode CNE1 and the second electrode CNE2.

The first electrode CNE1 may partially overlap one of the opposite ends EP1 and EP2 of each light emitting element LD. For example, the first electrode CNE1 may partially overlap the first end EP1 of each light emitting element LD.

The second electrode CNE2 may partially overlap one of the opposite ends EP1 and EP2 of each light emitting element LD that does not overlap the first electrode CNE1. For example, the second electrode CNE2 may partially overlap the second end EP2 of each light emitting element LD.

Each of the first and second electrodes CNE1 and CNE2 may be formed of a transparent conductive material. For example, the transparent conductive material may include indium tin oxide (ITO), indium zinc oxide (IZO), or indium tin zinc oxide (ITZO). In case that the first and second electrodes CNE1 and CNE2 are formed of a transparent conductive material, light emitted from each of the light emitting elements LD may travel in a frontal direction without loss. A material of the first and second electrodes CNE1 and CNE2 is not limited to the above-mentioned materials.

In an embodiment, the first and second electrodes (or first and second connection electrodes) CNE1 and CNE2 may be provided on an identical plane. The disposition of the first and second electrodes CNE1 and CNE2 is not limited thereto. In an embodiment, the first and second electrodes CNE1 and CNE2 may be disposed on different layers. For example, a separate insulating layer may be disposed on the first electrode CNE1, and the second electrode CNE2 may be disposed on the insulating layer.

The first and second electrodes CNE1 and CNE2 may be pixel electrodes of the display device and provide driving signals to the light emitting elements LD. One of the first and second electrodes CNE1 and CNE2 may be an anode, and the other may be a cathode. In an embodiment, the first electrode CNE1 may be an anode, and the second electrode CNE2 may be a cathode.

Referring to FIG. 3A, the first and second electrodes CNE1 and CNE2 each may be electrically connected with any of the driving circuit DC and the second driving power supply VSS through a contact hole (not illustrated) or a separate connection line. For example, the first electrode CNE1 may be electrically connected with the driving circuit DC. The second electrode CNE2 may be electrically connected with the second driving power supply VSS. The first and second electrodes CNE1 and CNE2 may be respectively electrically connected to the first end EP1 and the second end EP2 of the light emitting element LD so that a driving signal may be provided to the light emitting element LD. The light emitting element LD may emit light having a predetermined luminance corresponding to driving current provided from the driving circuit DC.

Although for the sake of explanation FIGS. 6A and 6B illustrate that the first and second electrodes CNE1 and CNE2 are directly provided on the substrate SUB, the disclosure is not limited thereto. For example, a component for enabling the display device to be driven as a passive matrix or an active matrix may be further provided between the substrate SUB and the first and second electrodes CNE1 and CNE2.

In some embodiments, a passivation layer (not shown) may be disposed on the first and second electrodes CNE1 and CNE2. The passivation layer may prevent the first and second electrodes CNE1 and CNE2 from being exposed to the outside, thereby preventing the first and second electrodes CNE1 and CNE2 from being corroded. Furthermore, the passivation layer may function as an encapsulating layer provided to prevent oxygen, water, or the like from penetrating into the light emitting elements LD.

The passivation layer may include an inorganic insulating layer formed of an inorganic material or an organic insulating layer formed of an organic material. The passivation layer may be formed of a signal layer, but the disclosure is not limited thereto, and it may be formed of multiple layers.

In some embodiments, an overcoat layer (not shown) may be further provided on the substrate SUB. The overcoat layer may be a planarization layer for mitigating a step difference formed by various components disposed thereunder.

Hereinafter, embodiments of the display device will be described. In the following embodiments, like reference numerals are used to designate the same components as those of the above-mentioned embodiments, and descriptions thereof will be omitted or simplified and focused on differences therefrom.

Figure 8:
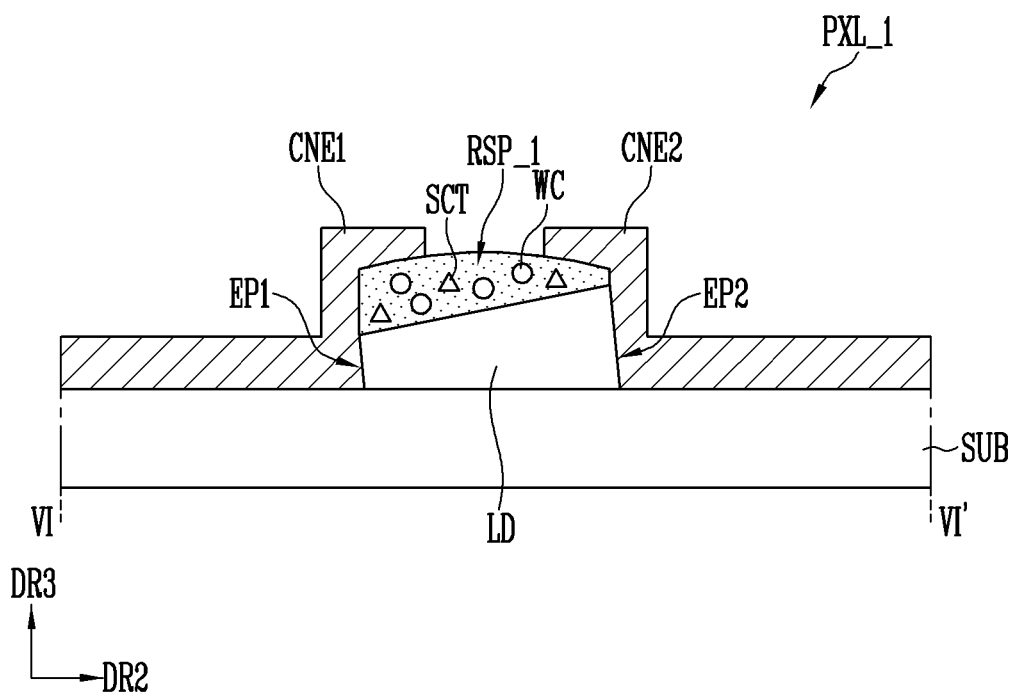
FIG. 8 illustrates an embodiment in which wavelength conversion particles are disposed in an organic pattern shown in FIG. 6A, and is a cross-sectional view corresponding to line VI-VI' of FIG. 5.

FIG. 8 illustrates an embodiment in which wavelength conversion particles are disposed in an organic pattern shown in FIG. 6A, and is a cross-sectional view corresponding to line VI-VI' of FIG. 5.

Referring to FIG. 8, a pixel PX_1 may include wavelength conversion particles WC and scattering particles SCT which are dispersed in an organic pattern RSP_1.

The wavelength conversion particles WC may convert or shift a peak wavelength of incident light to a different specific peak wavelength. In other words, the wavelength conversion particles WC may convert the color of the incident light.

For example, the light emitting element LD may provide blue light to the wavelength conversion particles WC of the organic pattern RSP_1. The wavelength conversion particles WC may convert the blue light provided from the light emitting element LD to different color light (e.g., blue or green light) and emit the converted light.

Examples of the wavelength conversion particles WC may include quantum dots, quantum rods, or fluorescent substances. A quantum dot may be a particulate material which emits light having a specific wavelength while an electron transitions from the conduction band to the valence band.

The quantum dot may be a semiconductor nanocrystal material. The quantum dot may have a specific bandgap depending on the composition and the size thereof, absorb light, and emit light having an intrinsic wavelength. Examples of a semiconductor nanocrystal of the quantum dot may include a group IV nanocrystal, a group II-VI compound nanocrystal, a group III-V compound nanocrystal, a group IV-VI nanocrystal, and a combination thereof.

For instance, examples of the group IV nanocrystal may include silicon (Si), germanium (Ge), and a binary compound such as silicon carbide (SiC) and silicon-germanium (SiGe), but the disclosure is not limited thereto.

Examples of the group II-VI compound nanocrystal may include binary compounds such as CdSe, CdTe, ZnS, ZnSe, ZnTe, ZnO, HgS, HgSe, HgTe, MgSe, MgS, and a mixture thereof, ternary compounds such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and quanternary compounds such as HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof. However, the disclosure is not limited thereto.

Examples of the group III-V compound nanocrystal may include binary compounds such as GaN, GaP, GaAs, GaSb, AlN, AlP, AlAs, AlSb, InN, InP, InAs, InSb, and a mixture thereof, ternary compounds such as GaNP, GaNAs, GaNSb, GaPAs, GaPSb, AlNP, AlNAs, AlNSb, AlPAs, AlPSb, InGaP, InNP, InNAs, InNSb, InPAs, InPSb, and a mixture thereof, and quanternary compounds such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. However, the disclosure is not limited thereto.

Examples of the group IV-VI nanocrystal may include binary compounds such as SnS, SnSe, SnTe, PbS, PbSe, PbTe, and a mixture thereof, ternary compounds such as SnSeS, SnSeTe, SnSTe, PbSeS, PbSeTe, PbSTe, SnPbS, SnPbSe, SnPbTe, and a mixture thereof, and quanternary compounds such as SnPbSSe, SnPbSeTe, SnPbSTe, and a mixture thereof. However, the disclosure is not limited thereto.

The quantum dot may have any shape which is generally used in the art, and the disclosure is not particularly limited. For example, a spherical, pyramid-shaped, multi-arm shaped, or cubic nanoparticle, nanotubes, nanowires, nanofibers, and nanoplate-shaped particles may be used. The binary compound, the ternary compound, or the quaternary compound may be present in particles at a substantially uniform concentration, or may be present in the same particles with different concentration distributions.

The quantum dot may have a core-shell structure including a core having the above-mentioned nanocrystal material, and a shell that encloses the core. An interface between the core and the shell may have a concentration gradient at which the concentration of elements that are present in the shell is reduced toward the center. The shell of the quantum dot may function as a protective layer for preventing the core from chemically changing so that semiconductor characteristics may be retained, and/or may function as a charging layer for assigning or imparting electrophoresis characteristics to the quantum dot. The shell may be formed of a single layer or multiple layers. Examples of the shell of the quantum dot may include metallic or nonmetallic oxide, a semiconductor compound, or a combination thereof.

For instance, although examples of metallic or nonmetallic oxide may include binary compounds such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO, or ternary compounds such as $MgAl_2O_4$, $CoFe_2O_4$, $NiFe_2O_4$, and $CoMn_2O_4$, the disclosure is not limited thereto.

Furthermore, although examples of the semiconductor compound may include CdS, CdSe, CdTe, ZnS, ZnSe, ZnTe, ZnSeS, GaAs, GaP, GaSb, HgS, HgSe, HgTe, InAs, InP, InSb, AlAs, AlP, and AlSb, the disclosure is not limited thereto.

Light emitted from the above-mentioned quantum dot may have a full width at half maximum (FWHM) of an emission wavelength spectrum that is approximately 45 nm or less. Therefore, the purity and reproducibility of a color expressed or displayed by the display device may be improved. Furthermore, light emitted from the quantum dot may be emitted in various directions regardless of a direction of incident light. Therefore, the side visibility of the display device may be improved.

The scattering particles SCT may be further disposed in the organic pattern RSP_1. The scattering particles SCT may have a refractive index different from that of the organic pattern RSP_1 and form an optical interface along with the organic pattern RSP_1. The material of each scattering particle SCT is not particularly limited, so long as it may scatter at least some or part of transmitted light. For example, the scattering particle SCT may be made of (or include) a metal oxide particle such as titanium oxide ($TiO_2$), zirconium oxide ($ZrO_2$), aluminum oxide ($Al_2O_3$), indium oxide ($In_2O_3$), zinc oxide (ZnO), or tin oxide ($SnO_2$).

Regardless of the direction of incident light, the scattering particle SCT may scatter the light in random directions. Therefore, the side visibility of the display device may be enhanced.

Figure 9:
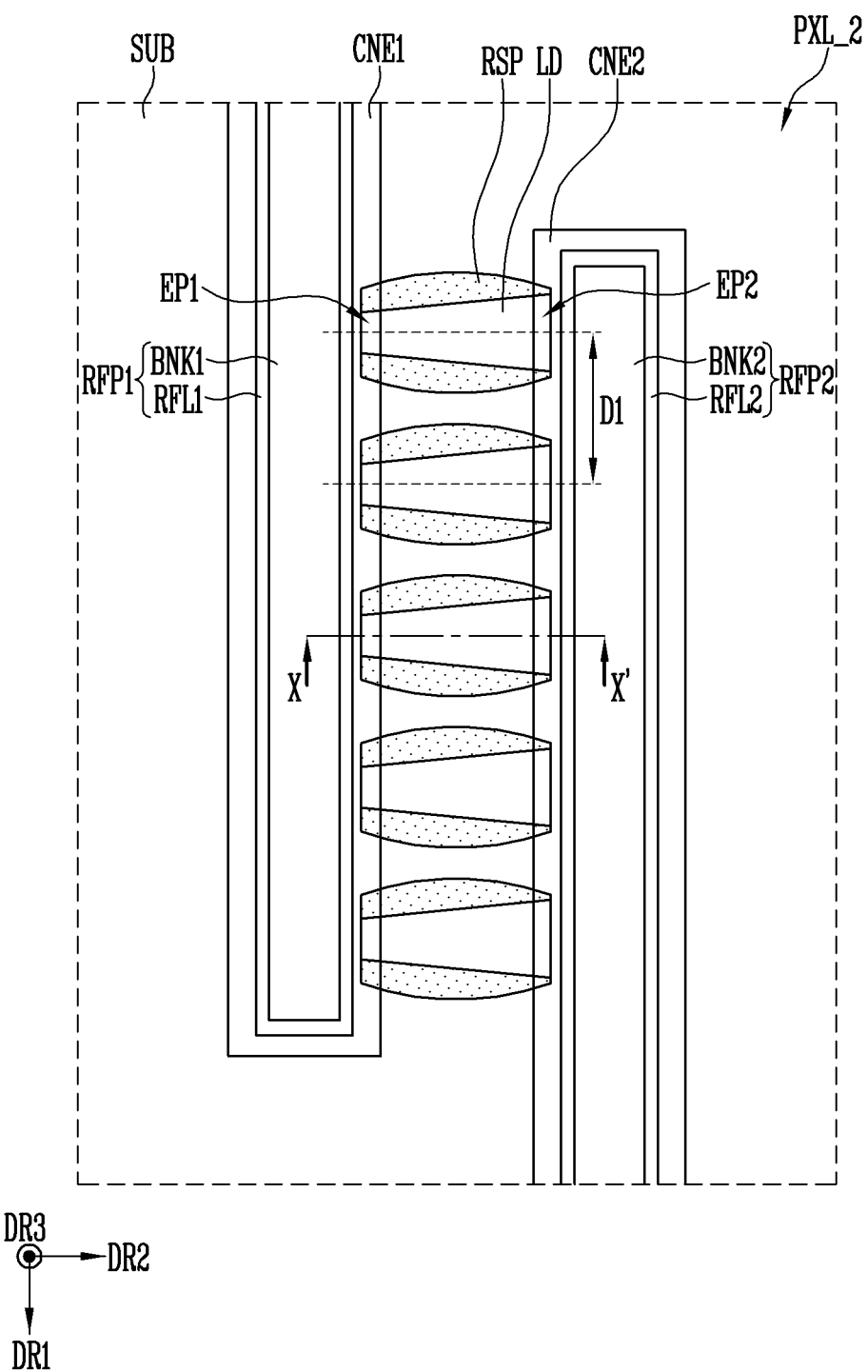
FIG. 9 is a plan view schematically illustrating a pixel in accordance with an embodiment.
Figure 10:
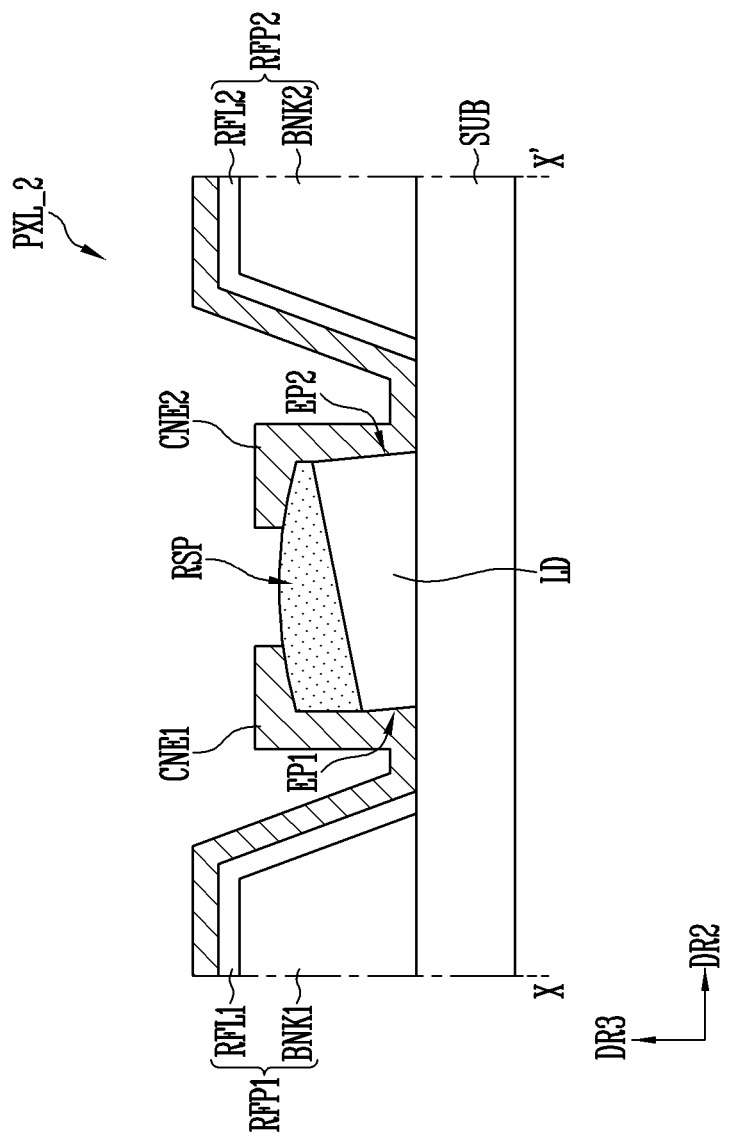
FIG. 10 is a cross-sectional view taken along line X-X' of FIG. 9.
Figure 11A:
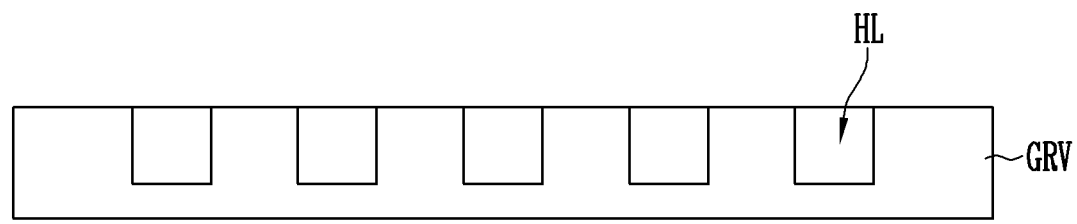
FIGS. 11A to 11H are schematic views sequentially illustrating a method of fabricating a pixel illustrated in FIGS. 5 to 7.
Figure 11B:
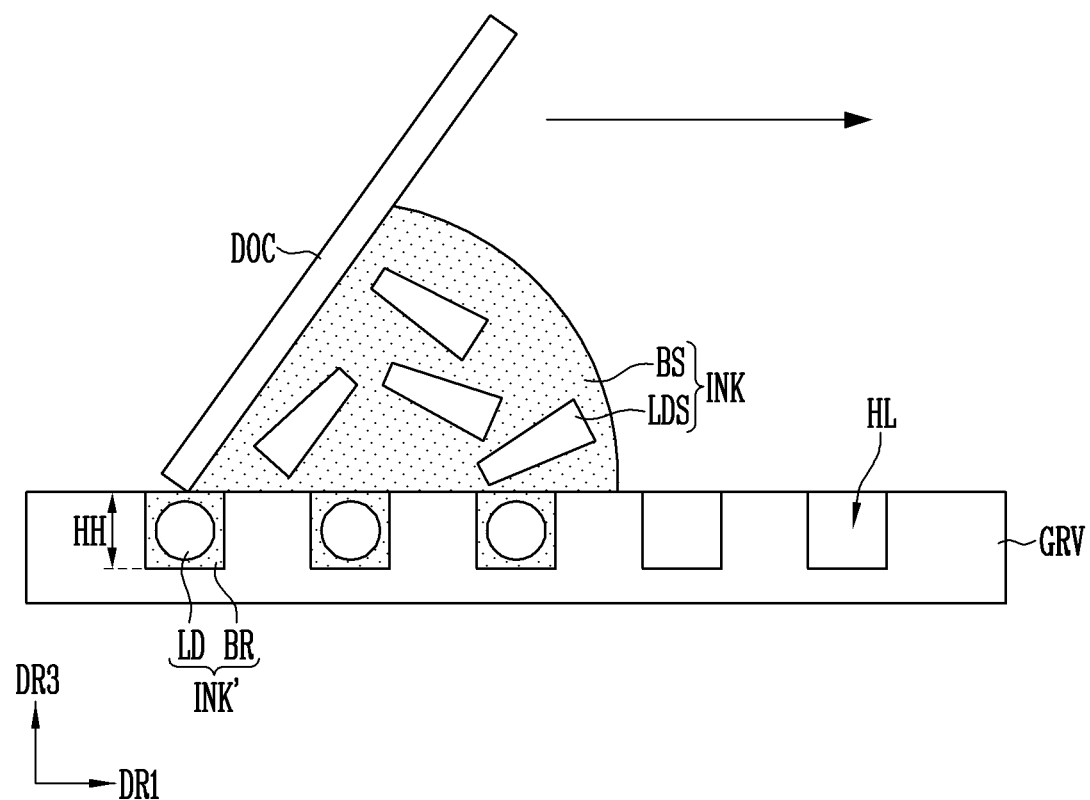
Figure 11C:
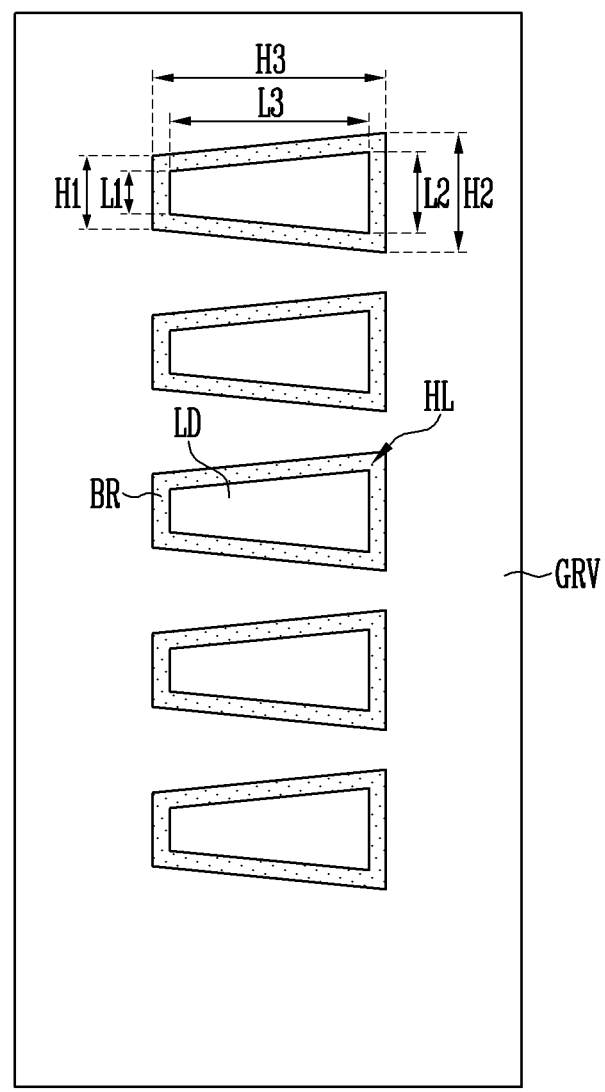
Figure 11D:
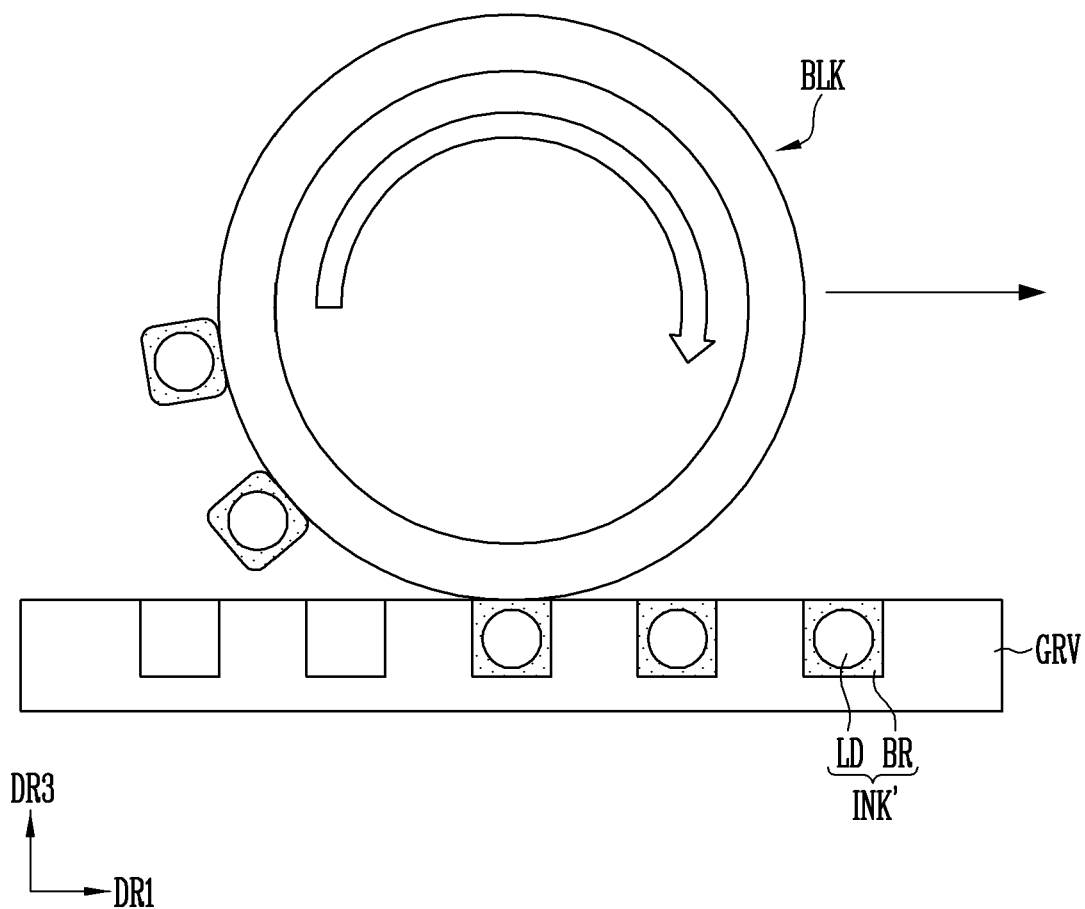
Figure 11E:
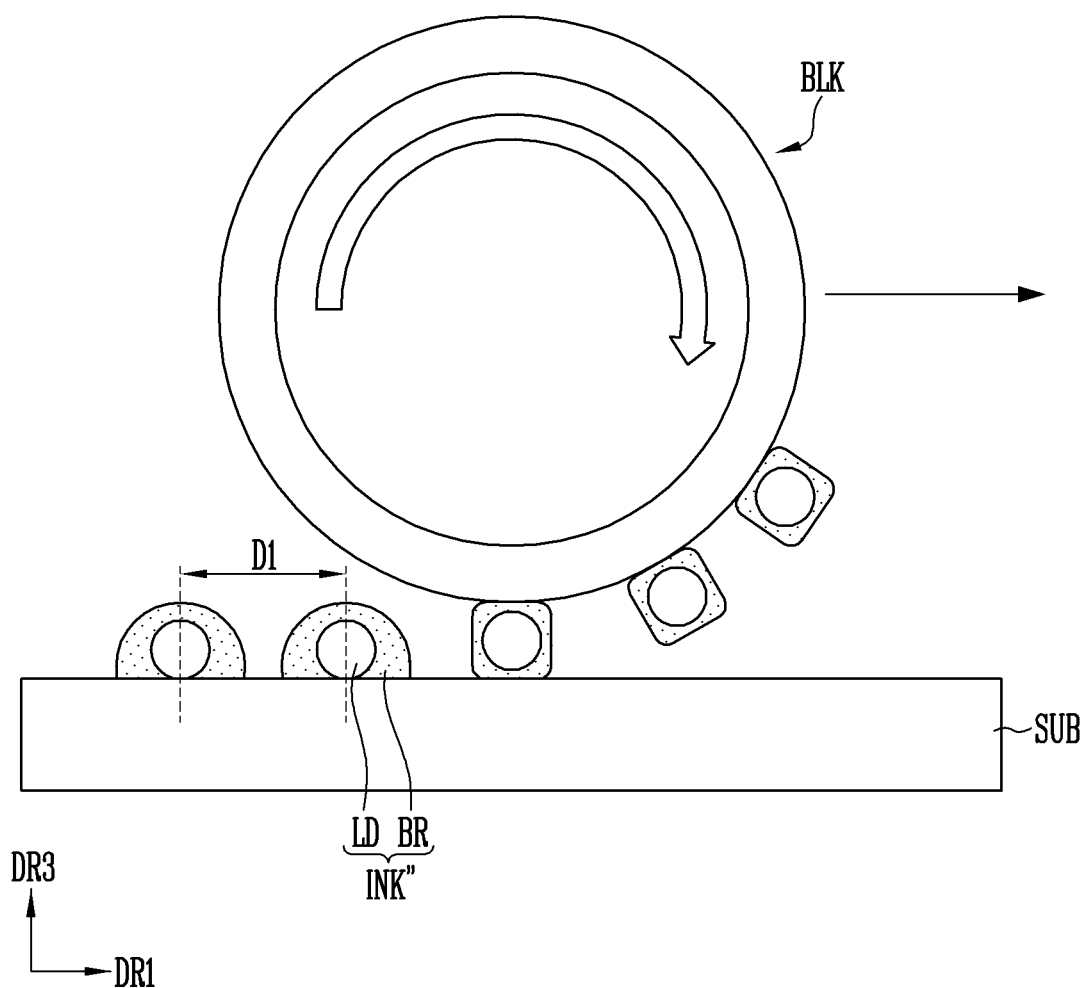
Figure 11F:
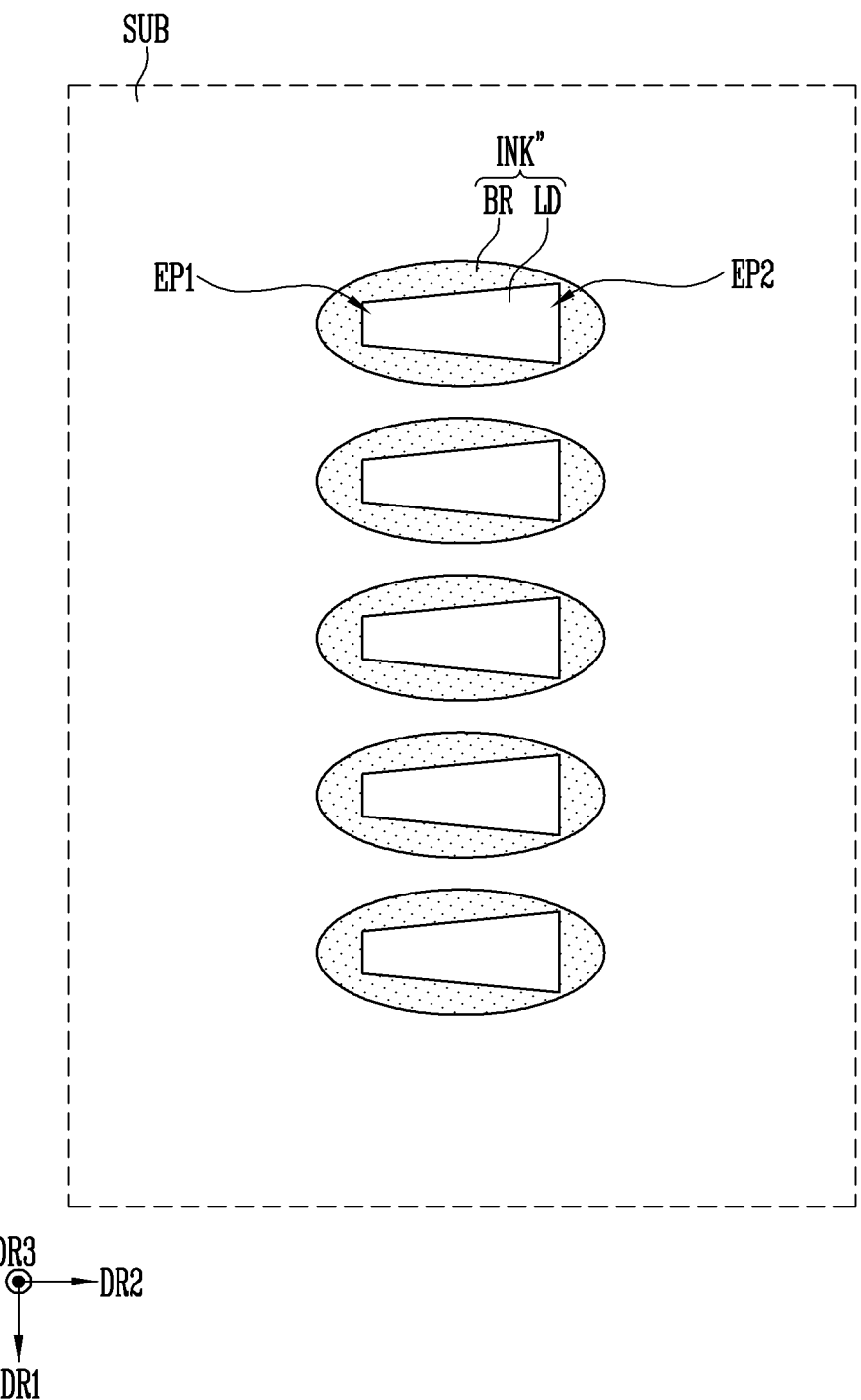
Figure 11G:
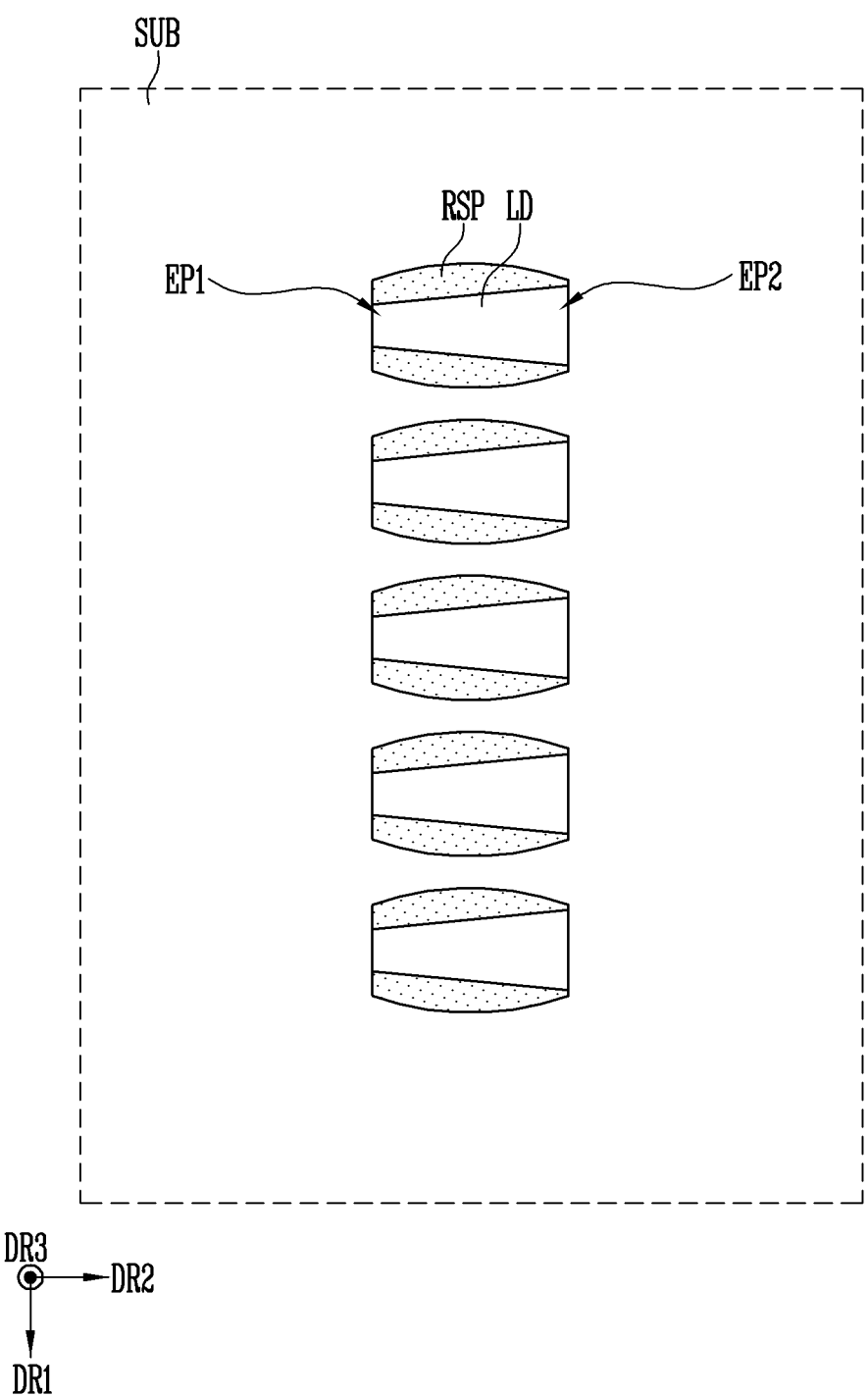
Figure 11H:
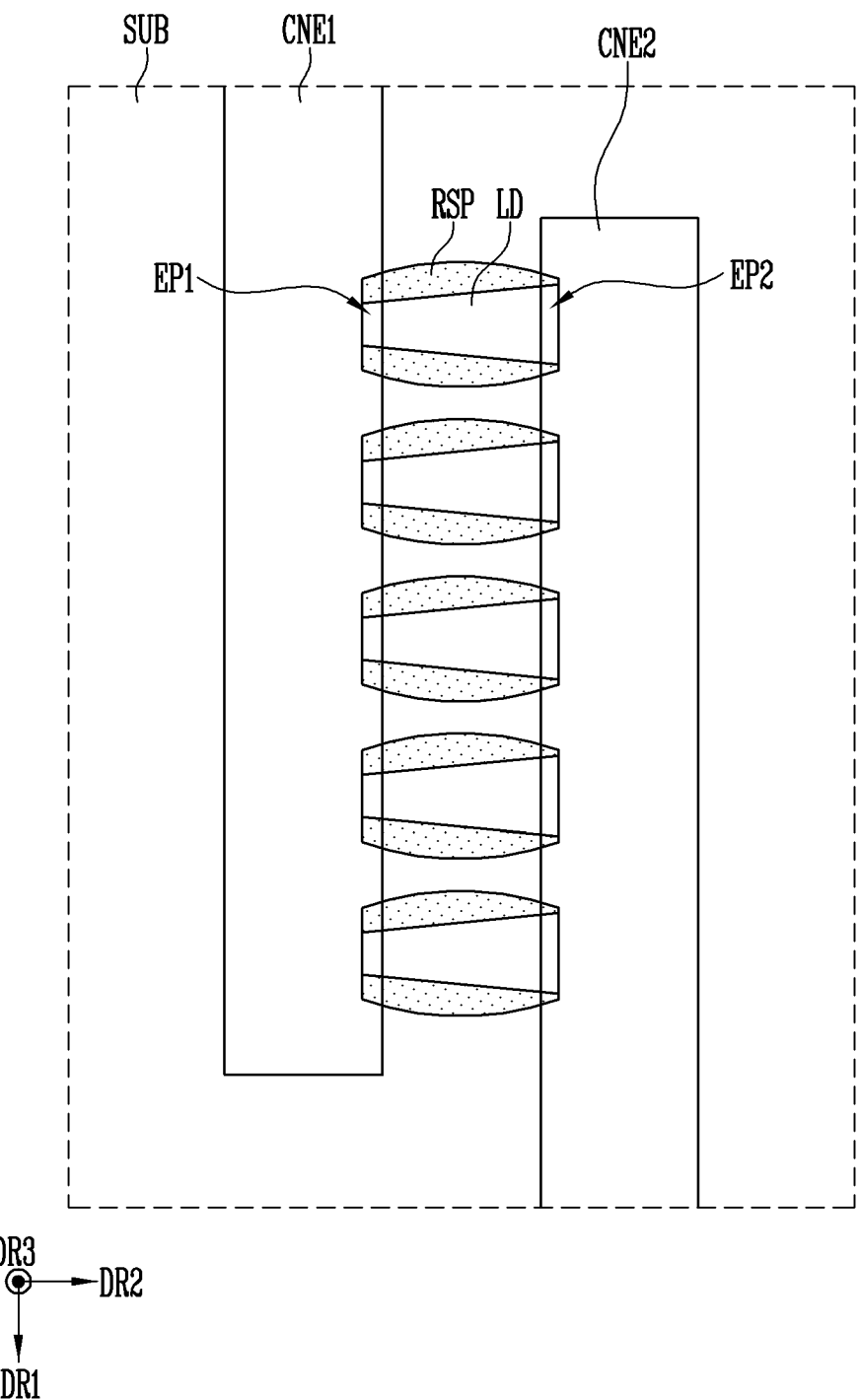

FIG. 9 is a schematic plan view illustrating a pixel in accordance with an embodiment. FIG. 10 is a schematic cross-sectional view of a pixel PXL 2 taken along line X-X' of FIG. 9.

The embodiments of FIGS. 9 and 10 differ from those of FIGS. 5 and 6A at least in that first and second reflective patterns RFP1 and RFP2 are further disposed on the substrate SUB, and the other components are identical or similar between the embodiments. Thus, the following description will be focused on differences.

Referring to FIGS. 9 and 10, a first reflective pattern RFP1 and a second reflective pattern RFP2 may be disposed on the substrate SUB. The first reflective pattern RFP1 may include a first bank BNK1 and a first reflective layer RFL1 disposed on the first bank BNK1. The second reflective pattern RFP2 may include a second bank BNK2 and a second reflective layer RFL2 disposed on the second bank BNK2.

For example, the first and second banks BNK1 and BNK2, along with the first and second reflective layers RFL1 and RFL2 provided thereon, may function as reflectors for enhancing the emission efficiency of light emitted from each light of the emitting elements LD.

The first bank BNK1 and the second bank BNK2 may be provided on the substrate SUB. Space in which the light emitting elements LD are disposed may be provided between the first bank BNK1 and the second bank BNK2. In an embodiment, the first bank BNK1 and the second bank BNK2 on the substrate SUB may be spaced apart from each other by a length of one light emitting element LD or more in the second direction DR2, and may extend in the first direction DR1.

The first and second banks BNK1 and BNK2 may be formed of an insulating material including an organic material or an inorganic material, but a material of the first and second banks BNK1 and BNK2 is not limited thereto.

Furthermore, each of the first and second banks BNK1 and BNK2 may have a trapezoidal shape in which sidewalls thereof are inclined at a predetermined angle, but the shapes of the first and second banks BNK1 and BNK2 are not limited thereto, and may have various shapes such as a semi-elliptical shape, a circular shape, and a rectangular shape.

The first reflective layer RFL1 and the second reflective layer RFL2 may be respectively provided on the corresponding banks BNK1 and BNK2. For example, the first reflective layer RFL1 may be provided on the first bank BNK1. The second reflective layer RFL2 may be provided on the second bank BNK2.

The first and second reflective layers RFL1 and RFL2 may be provided to correspond to the shapes of the first and second banks BNK1 and BNK2. Therefore, the first reflective layer RFL1 may have a shape corresponding to an inclination of the first bank BNK1, and the second reflective layer RFL2 may have a shape corresponding to an inclination of the second bank BNK2.

The first and second reflective layers RFL1 and RFL2 may be spaced apart from each other in the second direction DR2 with a light emitting element LD interposed therebetween on the substrate SUB, and may be provided to extend in the first direction DR1.

In an embodiment, the first reflective layer RFL1 may be disposed adjacent to the first end EP1 of each of the light emitting elements LD. The second reflective layer RFL2 may be disposed adjacent to the second end EP2 of each of the light emitting elements LD. The first reflective layer RFL1 and the second reflective layer RFL2 may be disposed on an identical plane and have an identical height.

The first and second reflective layers RFL1 and RFL2 may have a reflective material. The reflective material may include a metal, for example, Ag, Mg, Al, Pt, Pd, Au, Ni, Nd, Ir, Cr, T1, and an alloy thereof. However, the material of the first and second reflective layers RFL1 and RFL2 is not limited to the above-mentioned materials, so long as it is a material having a predetermined reflectivity.

Since the first and second reflective layers RFL1 and RFL2 have shapes corresponding to the shapes of the first and second banks BNK1 and BNK2, light emitted from the opposite ends EP1 and EP2 of each of the light emitting elements LD may be reflected by the first and second reflective layers RFL1 and RFL2 and more reliably travel in the third direction DR3. Hence, the light output efficiency of the display device may be enhanced.

In some embodiments, the first and second reflective layers RFL1 and RFL2 may be omitted. In this case, the first and second banks BNK1 and BNK2 may include a reflective material and reflect, in the third direction DR3, light provided from the light emitting element LD FIGS. 11A to 11H are schematic diagrams sequentially illustrating a method of fabricating the display device in accordance with an embodiment. Particularly, FIGS. 11A to 11H are diagrams sequentially illustrating the method of fabricating one pixel shown in FIGS. 5 to 7 through a gravure off-set printing scheme. Hereinafter, the method of fabricating the display device will be described in detail with reference to FIGS. 11A to 11H along with FIGS. 5 to 7.

Referring to FIGS. 5, 6A, 7, and 11A to 11C, grooves HL may be formed in a gravure substrate GRV. Each groove HL may be an area to which the light emitting element LD is to be input. The grooves HL may be formed at regular intervals in the first direction DR1. The grooves HL may have a predetermined height HH, which may be substantially equal to a thickness of a base resin BR described below.

Thereafter, light emitting element mixed ink INK may be applied onto the gravure substrate GRV in which the grooves HL are formed. The light emitting element mixed ink INK may be charged or disposed into the grooves HL of the gravure substrate GRV.

The light emitting element mixed ink INK may include a base resin BR, and light emitting elements LDS dispersed in the base resin BR. The light emitting elements LDS in the light emitting element mixed ink INK may be input into the grooves HL formed in the gravure substrate GRV. A light emitting element LD may be input to each groove HL.

The shape of each groove HL may be similar to the shape of the light emitting element LD. In other words, in a plan view, the shape of the groove HL may be an equilateral trapezoidal shape corresponding to that of the light emitting element LD. In a plan view, a width H1 of a top side of the groove HL may be less than a width H2 of a bottom side of the groove HL. Furthermore, a distance H3 between the top side and the bottom side of the groove HL (or a width of the groove HL in the second direction DR2) may be greater than the width H1 of the top side and the width H2 of the bottom side.

In a plan view, the width H1 of the top side of the groove HL may be greater than a width L1 of a top side of the light emitting element LD and less than a width L2 of a bottom side of the light emitting element LD. The width H2 of the bottom side of the groove HL may be greater than the width L2 of the bottom side of the light emitting element LD and be equal to or less than 1.5 times the width L2 of the bottom side of the light emitting element LD. Furthermore, the width H3 of the groove HL in the second direction DR2 may be greater than a height L3 of the light emitting element LD and be equal to or less than 1.5 times the height L3 of the light emitting element LD.

Therefore, in a plan view, a surface area of the groove HL may be greater than a surface area of the light emitting element LD so that the light emitting element LD may be stably disposed in the groove HL. Furthermore, the surface area of the groove HL is adjusted such that only one light emitting element is input thereinto, whereby two or more light emitting elements LD may be prevented from being input into one groove HL.

Subsequently, ink other than the base resin BR and the light emitting elements LD that are disposed in the grooves HL may be removed by a blade DOC, so that the surface of the gravure substrate GRV can become even.

The blade DOC may be used to scrape the surface of the gravure substrate GRV in the first direction DR1. The light emitting element mixed ink INK that is not charged into the grooves HL may be moved by the blade DOC in the first direction DR1, and the light emitting element mixed ink INK may be input into the grooves HL that are empty.

Referring to FIGS. 5, 6A, 7, and 11D, a blanket BLK may rotate and shift, so that a light emitting element mixed ink INK' that are charged in the grooves HL of the gravure substrate GRV may be transferred to the blanket BLK.

A resin film (not shown) which is integrally formed may be disposed on a surface of the blanket BLK. The resin film may have surface tension higher than that of the gravure substrate GRV. Therefore, as the blanket BLK shifts, the light emitting element mixed ink INK' charged in the grooves HL can be transferred to the blanket BLK.

In an embodiment, the blanket BLK may rotate without shifting. In this case, while the gravure substrate GRV that contacts the blanket BLK moves in a direction (e.g., in a direction opposite to the first direction DR1), the light emitting element mixed ink INK' charged in the grooves HL may be transferred to the blanket BLK.

Referring to FIGS. 5, 6A, 7, 11E, and 11F, the blanket BLK to which the light emitting element mixed ink INK' is attached may be disposed on the substrate SUB. Thereafter, if the blanket BLK rotates and shifts, the light emitting element mixed ink INK' that has been attached to the blanket BLK may be transferred onto the substrate SUB.

Here, the surface tension of the substrate SUB may be greater than the surface tension of the resin film (not shown) disposed on the surface of the blanket BLK. Furthermore, the blanket BLK may apply a pressure to the substrate SUB. Therefore, the light emitting element mixed ink INK' attached to the surface of the blanket BLK may be transferred onto the substrate SUB.

A light emitting element mixed ink INK" transferred onto the substrate SUB may have a substantially round surface because of the surface tension of the base resin BR. The base resin BR may completely cover the light emitting element LD and fix the light emitting element LD on the substrate SUB.

In an embodiment, the light emitting element LD may have a density higher than that of the base resin BR. Thus, the light emitting element LD can move toward the substrate SUB, and at least a portion of the light emitting element LD may contact the substrate SUB.

The light emitting element mixed ink INK" transferred onto the substrate SUB may be disposed at positions spaced apart from each other at regular intervals (e.g., D1) in the first direction DR1. All of the light emitting elements LD in the light emitting element mixed ink INK" may be oriented in an identical direction. For example, the first end EP1 of the light emitting element LD may be oriented in a direction opposite to the second direction DR2, and the second end EP2 thereof may be oriented in the second direction DR2.

In an embodiment, the blanket BLK may rotate without shifting. In this case, while the substrate SUB that contacts the blanket BLK moves in a direction (e.g., in a direction opposite to the first direction DR1), the light emitting element mixed ink INK' attached to the surface of the blanket BLK may be transferred to the substrate SUB.

Referring to FIGS. 5, 6, 7, 11G, and 11H, the first end EP1 and the second end EP2 of the light emitting element LD may be exposed to the outside by removing portions of the base resin BR that covers (or overlaps) the first end EP1 and the second end EP2 of the light emitting element LD.

The organic pattern RSP may be formed by removing the base resin BR that covers the first end EP1 and the second end EP2 of the light emitting element LD. The organic pattern RSP may cover the sidewalls of the light emitting element LD and a portion of the substrate SUB. The organic patterns RSP disposed on each light emitting element LD may be spaced apart from each other.

Thereafter, the first electrode CNE1 and the second electrode CNE2 may be formed on the substrate SUB. The first electrode CNE1 and the second electrode CNE2 may be formed to extend in the first direction DR1.

As described above, the first electrode CNE1 and the second electrode CNE2 each may be formed of a transparent conductive material. For example, the transparent conductive material may include ITO, IZO, ITZO, etc.

The first electrode CNE1 and the second electrode CNE2 may partially overlap the light emitting element LD. In an embodiment, the first electrode CNE1 may overlap the first end EP1 of the light emitting element LD, and the second electrode CNE2 may overlap the second end EP2 of the light emitting element LD. Hence, the first electrode CNE1 and the second electrode CNE2 may be electrically connected with the light emitting element LD and provide a driving signal to the light emitting element LD.

As described above, in case that the light emitting elements LD are disposed on the substrate SUB by the gravure off-set printing method, the light emitting elements LD may be disposed at positions spaced apart from each other at regular intervals, and the light emitting elements LD may be disposed to be aligned in an identical direction. Therefore, an alignment process and components (e.g., an alignment line) for aligning the light emitting elements LD disposed on the substrate SUB are not required, so that the fabrication cost may be reduced.

The shape of each groove HL formed in the gravure substrate GRV is not limited to the foregoing example. The shape of the groove HL may be changed in various ways depending on fabrication conditions, whereby the alignment direction, the alignment position, etc. of the light emitting elements LD may be changed in various ways. In other words, the light emitting elements LD may be disposed in a desired direction and at desired positions on the substrate SUB by adjusting the shape, the position, etc. of the groove HL.

Although the embodiments of the disclosure have been disclosed, those skilled in the art will appreciate that the disclosure can be implemented as other concrete forms, without departing from the scope and spirit of the disclosure as disclosed in the accompanying claims. Therefore, it should be understood that the embodiments are only for illustrative purpose and do not limit the bounds of the disclosure.

What is claimed is:

1. A display device comprising:
    a light emitting element disposed on a substrate, and comprising:
        a first end including a first surface; and
        a second end including a second surface parallel to the first surface;
    an organic pattern that overlaps the light emitting element and exposes the first surface and the second surface;
    a first electrode disposed on the substrate and electrically contacting the first end; and
    a second electrode disposed on the substrate and spaced apart from the first electrode, and electrically contacting the second end, wherein
    a surface area of the first surface is less than a surface area of the second surface, and
    a top surface of the organic pattern is a curved surface.

2. The display device according to claim 1, wherein the top surface of the organic pattern is a convex surface protruding in a thickness direction of the substrate.

3. The display device according to claim 1, further comprising:
    scattering particles dispersed in the organic pattern,
    wherein the scattering particles include at least one of titanium oxide ($TiO_2$), zirconium oxide ($ZrO_2$), aluminum oxide ($Al_2O_3$), indium oxide ($In_2O_3$), zinc oxide (ZnO), and tin oxide ($SnO_2$).

4. The display device according to claim 1, further comprising:
    wavelength conversion particles dispersed in the organic pattern,
    wherein the wavelength conversion particles include quantum dots.

5. The display device according to claim 1, further comprising
    a first reflective pattern disposed adjacent to the first surface, and
    a second reflective pattern disposed adjacent to the second surface.

6. The display device according to claim 5, wherein
    the first reflective pattern comprises;
        a first bank disposed on the substrate; and
        a first reflective layer disposed along a surface of the first bank, and
    the second reflective pattern comprises:
        a second bank disposed on the substrate; and
        a second reflective layer disposed along a surface of the second bank.

7. The display device according to claim 6, wherein
    the first electrode overlaps the first reflective pattern and is disposed on the first reflective layer, and
    the second electrode overlaps the second reflective pattern and is disposed on the second reflective layer.

8. The display device according to claim 7, wherein the first bank and the second bank each have a trapezoidal shape having sidewalls inclined at an angle.

9. A display device comprising:
    a light emitting element disposed on a substrate at regular intervals in a first direction, and comprising:
        a first end including a first surface; and
        a second end including a second surface parallel to the first surface;
    a plurality of organic patterns respectively disposed on the light emitting elements, and each exposing the first surface and the second surface;
    a first electrode electrically contacting the first end; and
    a second electrode electrically contacting the second end, wherein
    the first electrode and the second electrode are disposed on the substrate and spaced apart from each other in a second direction intersecting the first direction,
    a top surface of each of the plurality of organic patterns is a convex surface protruding in a third direction intersecting the first direction and the second direction.

10. The display device according to claim 9, wherein the plurality of organic patterns are spaced apart from each other without contacting each other.

11. The display device according to claim 9, further comprising scattering particles dispersed in the plurality of organic patterns,
wherein the scattering particles include at least one of titanium oxide ($TiO_2$), zirconium oxide ($ZrO_2$), aluminum oxide ($Al_2O_3$), indium oxide ($In_2O_3$), zinc oxide (ZnO), and tin oxide ($SnO_2$).

12. The display device according to claim 11, further comprising wavelength conversion particles dispersed in the plurality of organic patterns,
wherein the wavelength conversion particles include quantum dots.

13. The display device according to claim 9, further comprising:
a first reflective pattern disposed adjacent to the first end and disposed on the substrate; and
a second reflective pattern disposed adjacent to the second end and disposed on the substrate.

14. A method of fabricating a display device, comprising:
preparing a gravure substrate including a groove;
disposing, into the groove, ink including a base resin and light emitting elements dispersed in the base resin;
transferring the ink disposed in the groove to a blanket;
transferring, to the substrate, the ink transferred to the blanket;
forming an organic pattern by removing at least a portion of the base resin; and
forming, on the substrate, a first electrode and a second electrode partially overlapping the light emitting element, and spaced apart from each other in a direction.

15. The method according to claim 14, wherein
the light emitting element comprises:
a first surface; and
a second surface parallel to the first direction, a surface area of the first surface being less than a surface area of the second surface, and
the forming of the organic pattern comprises removing at least a portion of the base resin such that the first surface and the second surface are exposed.

16. The method according to claim 15, wherein
the first electrode electrically contacts the first surface, and
the second electrode electrically contacts the second surface.

17. The method according to claim 16, wherein a top surface of the organic pattern is a curved surface.

18. The method according to claim 14, wherein the disposing of the ink including the base resin and the light emitting elements comprises:
applying the ink onto the gravure substrate; and
removing, using a blade that scrapes a surface of the gravure surface, the ink that is not disposed into the groove.

19. The method according to claim 14, wherein;
in a plan view, a surface area of the groove is greater than a surface area of the light emitting element, and
one light emitting element is disposed into the groove.

20. The method according to claim 14, wherein
the gravure substrate includes a plurality of grooves, and
the plurality of grooves are spaced apart from each other at regular intervals.

* * * * *